(12) United States Patent
Takahashi

(10) Patent No.: US 10,228,576 B2
(45) Date of Patent: Mar. 12, 2019

(54) SEMICONDUCTOR DEVICE, DISPLAY PANEL, AND ELECTRONIC DEVICE

(71) Applicant: Semiconductor Energy Laboratory Co., Ltd., Atsugi-shi, Kanagawa-ken (JP)

(72) Inventor: Kei Takahashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/223,198

(22) Filed: Jul. 29, 2016

(65) Prior Publication Data

US 2017/0053584 A1 Feb. 23, 2017

(30) Foreign Application Priority Data

Aug. 17, 2015 (JP) ................. 2015-160303

(51) Int. Cl.
*G02F 1/133* (2006.01)
*G09G 3/3283* (2016.01)
*H01L 27/28* (2006.01)

(52) U.S. Cl.
CPC .......... *G02F 1/133* (2013.01); *G09G 3/3283* (2013.01); *H01L 27/28* (2013.01); *G09G 2300/0426* (2013.01); *G09G 2310/027* (2013.01); *G09G 2310/0291* (2013.01); *G09G 2330/028* (2013.01)

(58) Field of Classification Search
CPC . G09G 3/2011; H03K 5/2481; H03M 1/0639; H04N 5/3575
See application file for complete search history.

(56) References Cited

U.S. PATENT DOCUMENTS

| | | | |
|---|---|---|---|
| 8,462,145 B2 | 6/2013 | Kim et al. | |
| 8,742,964 B2 | 6/2014 | Kleks et al. | |
| 2005/0140630 A1 | 6/2005 | Kikuchi et al. | |
| 2010/0141493 A1 | 6/2010 | Cho et al. | |
| 2010/0156867 A1 | 6/2010 | Kim et al. | |
| 2010/0225514 A1* | 9/2010 | Inoue ................. | H03M 1/0607 341/122 |

(Continued)

OTHER PUBLICATIONS

Jeon.Y et al., "A Piecewise-Linear 10b DAC Architecture with Drain-Current Modulation for Compact AMLCD Driver ICs", ISSCC 2009 (Digest of Technical Papers. IEEE International Solid-State Circuits Conference), Feb. 8, 2009, pp. 264-265.265a.

*Primary Examiner* — Abbas I Abdulselam
(74) *Attorney, Agent, or Firm* — Fish & Richardson P.C.

(57) ABSTRACT

A semiconductor device having a novel structure is provided. Fluctuation in the grayscale voltage due to an offset voltage is suppressed. When a current corresponding to a lower-bit grayscale voltage is generated in a transconductance amplifier, voltages $V_{HI}$ and $V_{LO}$ supplied to the transconductance amplifier are alternately input to two input terminals in accordance with a digital signal of the most significant bit of lower bits. Since a change corresponding to the offset voltage is added to both the maximum and minimum values of the current output from the transconductance amplifier, fluctuation in the grayscale voltage due to the offset voltage can be suppressed.

17 Claims, 23 Drawing Sheets

(56) References Cited

U.S. PATENT DOCUMENTS

| | | | | |
|---|---|---|---|---|
| 2011/0148835 A1* | 6/2011 | Yamazaki | ........... | G02F 1/13318 345/207 |
| 2012/0098738 A1* | 4/2012 | Yoshida | ............... | G09G 3/2025 345/102 |
| 2014/0146010 A1* | 5/2014 | Akai | ..................... | G06F 3/0416 345/174 |
| 2014/0266309 A1* | 9/2014 | Jakobson | ............... | H04N 5/378 327/63 |

* cited by examiner

10A

FIG. 20A
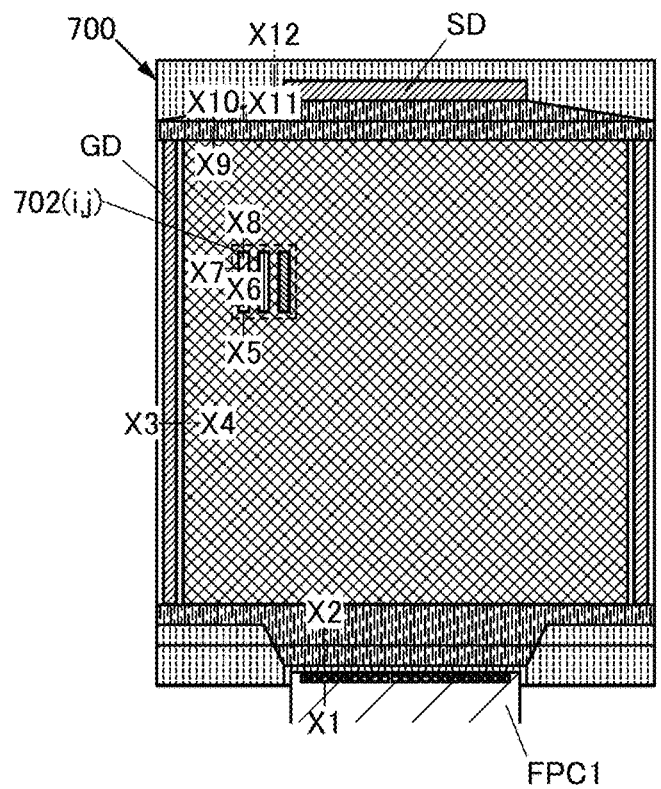
FIG. 20B1
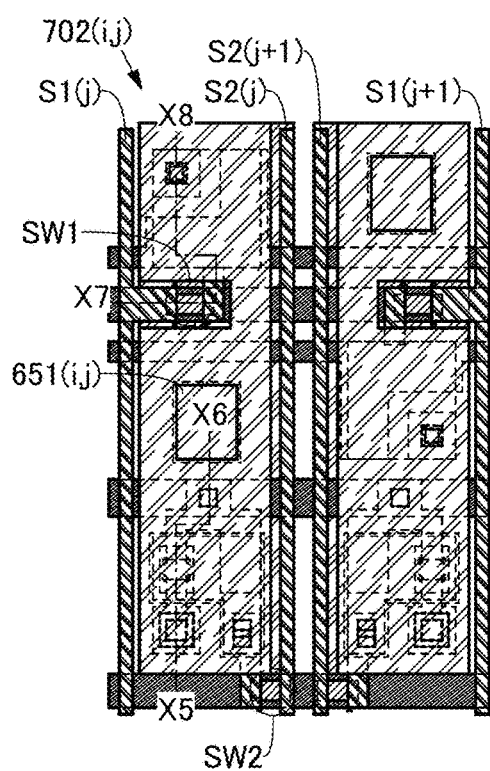
FIG. 20B2
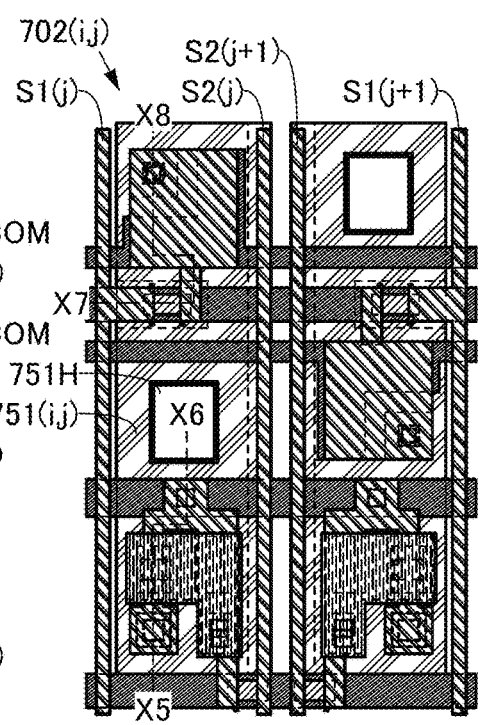

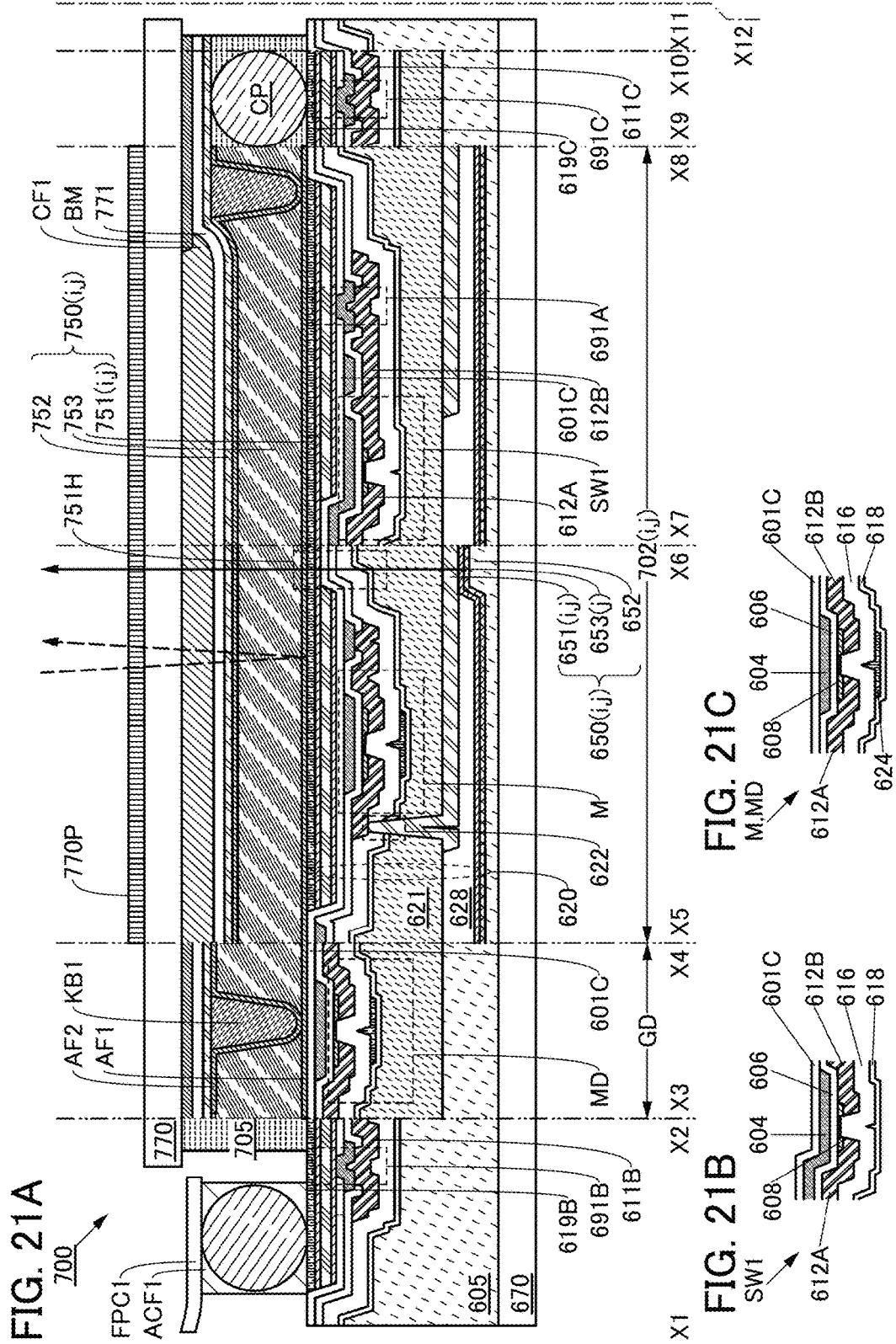

FIG. 23A
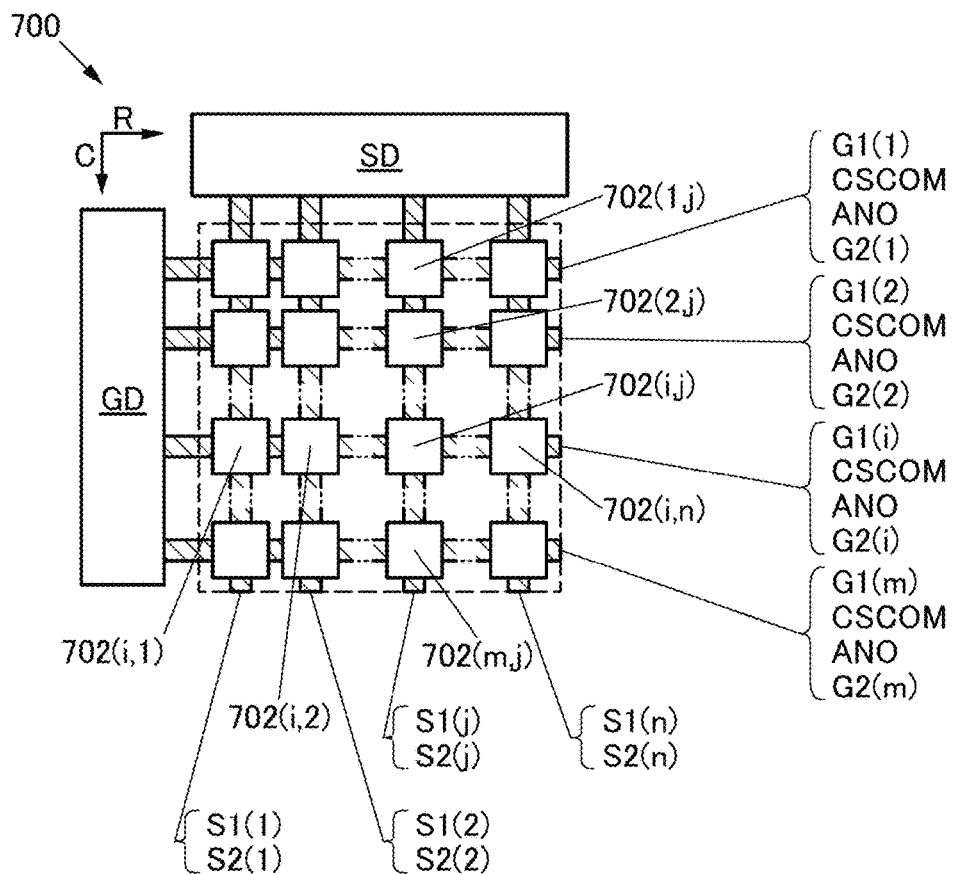
FIG. 23B1
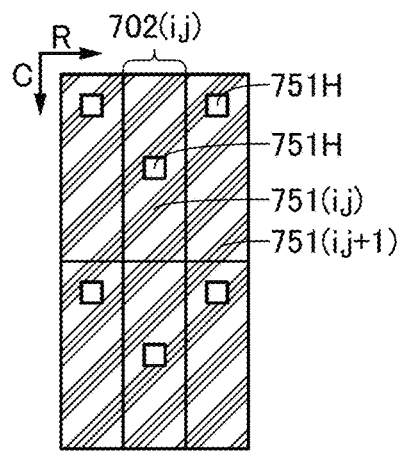
FIG. 23B2
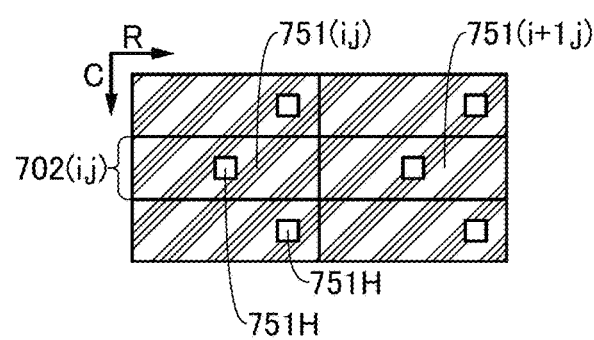

SEMICONDUCTOR DEVICE, DISPLAY PANEL, AND ELECTRONIC DEVICE

BACKGROUND OF THE INVENTION

1. Field of the Invention

One embodiment of the present invention relates to a semiconductor device, a display panel, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

There has been a trend toward higher performance (e.g., multiple gray levels and higher definition) of display devices. To meet the demand for higher performance, an integrated circuit (IC, hereinafter also referred to as a driver IC) is used as a driver circuit of a display device, particularly as a source driver.

A driver IC includes a grayscale voltage generation circuit for generating an analog signal supplied to pixels. The grayscale voltage generation circuit is a digital-to-analog (D/A) converter circuit, which generates an analog signal based on a digital signal.

As the D/A converter circuit, a resistor digital-to-analog converter (R-DAC), in which resistors are provided in series, is used in consideration of the requirement of high response speed. The number of switches in an R-DAC increases exponentially with the increase in the number of bits of digital signals; thus, the circuit area of a driver IC increases.

In view of the above, Patent Documents 1 to 3 suggest a structure for obtaining a desired analog signal in such a manner that a digital signal of an upper bit and a digital signal of a lower bit are independently converted to synthesize respective analog signals.

REFERENCE

Patent Document

[Patent Document 1] United States Patent Application Publication No. 2005/0140630
[Patent Document 2] United States Patent Application Publication No. 2010/0156867
[Patent Document 3] United States Patent Application Publication No. 2010/0141493

SUMMARY OF THE INVENTION

As described above, there are a variety of structures of semiconductor devices functioning as grayscale voltage generation circuits. The structures have merits and demerits, and an appropriate structure is selected depending on circumstances. Thus, a proposal for a semiconductor device that has a novel structure and functions as a grayscale voltage generation circuit leads to higher degree of freedom of choice.

In view of the above, an object of one embodiment of the present invention is to provide a novel semiconductor device that has a structure different from that of an existing semiconductor device functioning as a grayscale voltage generation circuit, a novel electronic component, a novel electronic device, or the like.

When a current DAC is employed as in Patent Document 2, the switch is composed of a transistor with high withstand voltage. The increase in the number of switches due to the increase in the number of bits of digital signals causes a larger circuit area. Moreover, the increase in the number of switches due to a larger number of digital signal bits causes the increase in parasitic capacitance of an output portion, resulting in lower response speed.

In a structure disclosed in Patent Document 3, a voltage is supplied to a differential circuit provided in an input stage. In this structure, an output analog signal is influenced by an offset voltage of a transistor. If the output voltage which is changed by the offset voltage exceeds a desired grayscale voltage, display quality might be degraded, e.g., desired grayscale display might not be obtained.

In light of the above, an object of one embodiment of the present invention is to provide a semiconductor device or the like with a novel structure and a small circuit area. Another object of one embodiment of the present invention is to provide a semiconductor device or the like with a novel structure and improved display quality.

Note that the objects of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device which has a function of converting an N-bit digital signal (N is a natural number of 2 or more) into an analog signal and includes a digital-to-analog converter circuit, a first differential amplifier circuit, a second differential amplifier circuit, a current-voltage converter circuit, and a switching circuit. The digital-to-analog converter circuit generates a first voltage and a second voltage on the basis of an upper (N−M)-bit digital signal (M is a natural number smaller than N). The first differential amplifier circuit generates a first current corresponding to a difference between the first voltage and the second voltage on the basis of a current flowing in a first current source. The second differential amplifier circuit generates a second current corresponding to a difference between the first voltage and an output voltage of the semiconductor device on the basis of a current flowing in a second current source. The current-voltage converter circuit generates the output voltage on the basis of a current that is the sum of the first current and the second current. The first differential amplifier circuit includes a first input terminal and a second input terminal. The switching circuit switches between a first state in which the first voltage is supplied to the first input terminal and the second voltage is supplied to the second input terminal and a second state in which the first voltage is supplied to the second input terminal and the second voltage is supplied to the first input terminal. The switching circuit switches between the first state and the second state in accordance with an M-bit digital signal.

In the semiconductor device of one embodiment of the present invention, the digital-to-analog converter circuit preferably includes resistors connected in series and a pass transistor logic circuit to which the (N–M)-bit digital signal is supplied.

In the semiconductor device of one embodiment of the present invention, the first and second differential amplifier circuits are preferably transconductance amplifiers.

In the semiconductor device of one embodiment of the present invention, the first current source preferably includes resistors connected in series and a pass transistor logic circuit to which the M-bit digital signal is supplied, and generates a current on the basis of a voltage value selected in the pass transistor logic circuit.

Note that other embodiments of the present invention will be described in the following embodiments with reference to the drawings.

One embodiment of the present invention can provide a novel semiconductor device, a novel electronic device, or the like.

One embodiment of the present invention can provide a semiconductor device or the like with a novel structure and a small circuit area. One embodiment of the present invention can provide a semiconductor device or the like with a novel structure and improved display quality.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the aforementioned effects and the other effects. Accordingly, one embodiment of the present invention does not have the aforementioned effects in some cases.

BRIEF DESCRIPTION OF THE DRAWINGS

In the accompanying drawings:

FIGS. 20A, 20B1, and 20B2 illustrate a structure of a display panel of an embodiment;

FIGS. 21A to 21C illustrate a structure of a display panel of an embodiment;

FIGS. 23A, 23B1, and 23B2 illustrate a structure of a display panel of an embodiment.

DETAILED DESCRIPTION OF THE INVENTION

Figure 1:
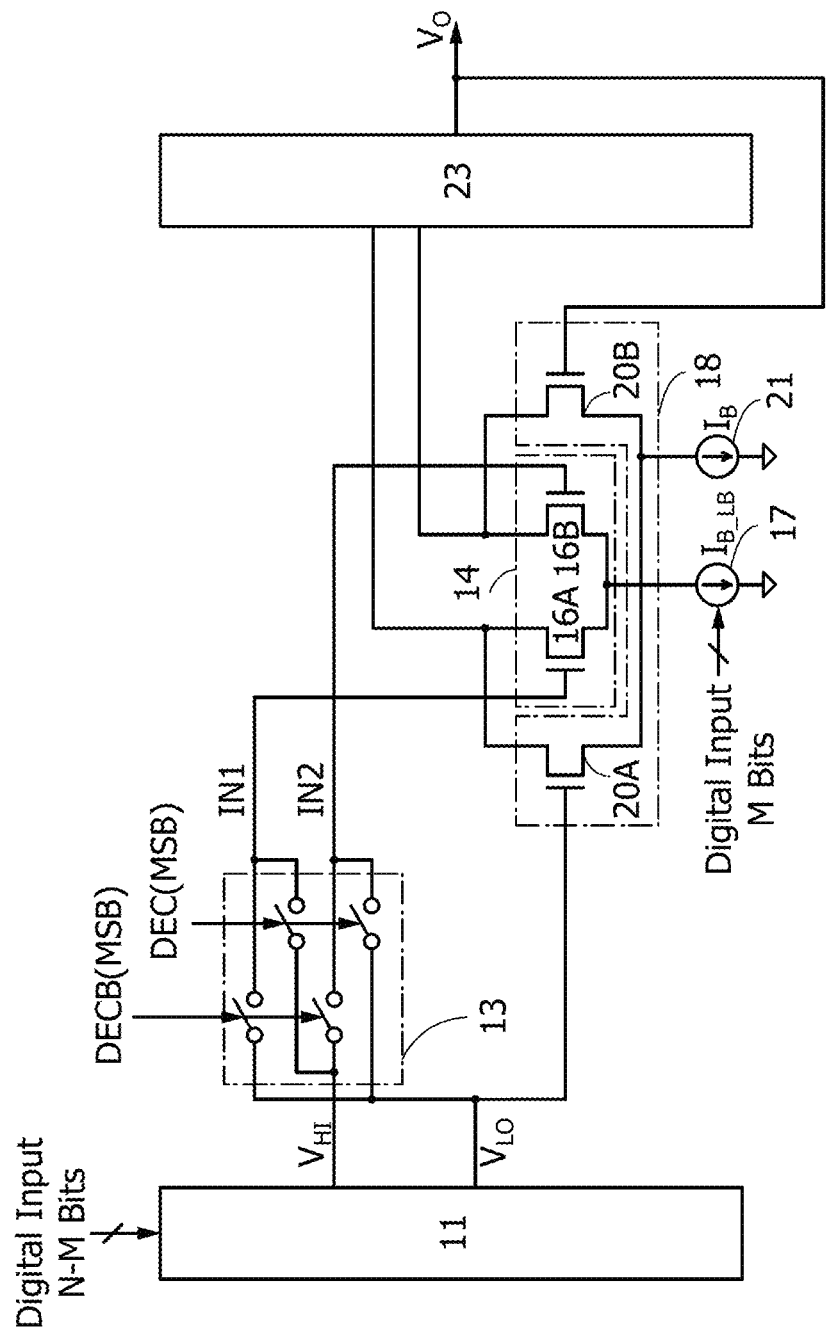
FIG. 1 is a circuit diagram illustrating one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components. In the present specification and the like, a "first" component in one embodiment can be referred to as a "second" component in other embodiments or claims. Furthermore, in the present specification and the like, a "first" component in one embodiment can be referred to without the ordinal number in other embodiments or claims.

The same elements or elements having similar functions, elements formed using the same material, elements formed at the same time, or the like in the drawings are denoted by the same reference numerals, and the description thereof is not repeated in some cases.

Embodiment 1

In this embodiment, an example of a semiconductor device functioning as a grayscale voltage generation circuit will be described.

In this specification and the like, a semiconductor device generally means a device that can function by utilizing semiconductor characteristics. Thus, a driver IC composed of semiconductor elements such as transistors and a display device including the driver IC are included in the category of the semiconductor device.

<Structure of Semiconductor Device>

FIG. 1 is a circuit diagram illustrating an example of a circuit structure for describing a semiconductor device 10.

The semiconductor device 10 includes a digital-to-analog converter circuit (hereinafter referred to as a D/A converter circuit) 11, a differential amplifier circuit 14, a current source 17, a differential amplifier circuit 18, a current source 21, a switching circuit 13, and a current-voltage converter circuit 23.

In the case where an N-bit digital signal (N is a natural number of 2 or more) is input to the semiconductor device 10, the D/A converter circuit 11 converts an upper (N–M)-bit digital signal (M is a natural number smaller than N) into an analog signal. The D/A converter circuit 11 outputs a voltage $V_{HI}$ and a voltage $V_{LO}$ as analog signals. The D/A converter circuit 11 is simply referred to as a circuit in some cases.

The voltage $V_{HI}$ and the voltage $V_{LO}$ are determined on the basis of an upper-bit digital signal. An output voltage $V_O$ output from the semiconductor device 10 is generated using the voltage $V_{HI}$ and the voltage $V_{LO}$ determined in the D/A converter circuit 11.

The differential amplifier circuit 14 includes a transistor 16A and a transistor 16B. The differential amplifier circuit 14 can change the amount of current flowing between the differential amplifier circuit 14 and the current-voltage converter circuit 23 in accordance with a current $I_{B\_LB}$ flowing in the current source 17 and a difference between voltages supplied to gates of the transistors 16A and 16B. The differential amplifier circuit 14 is simply referred to as a circuit in some cases.

Figure 19:
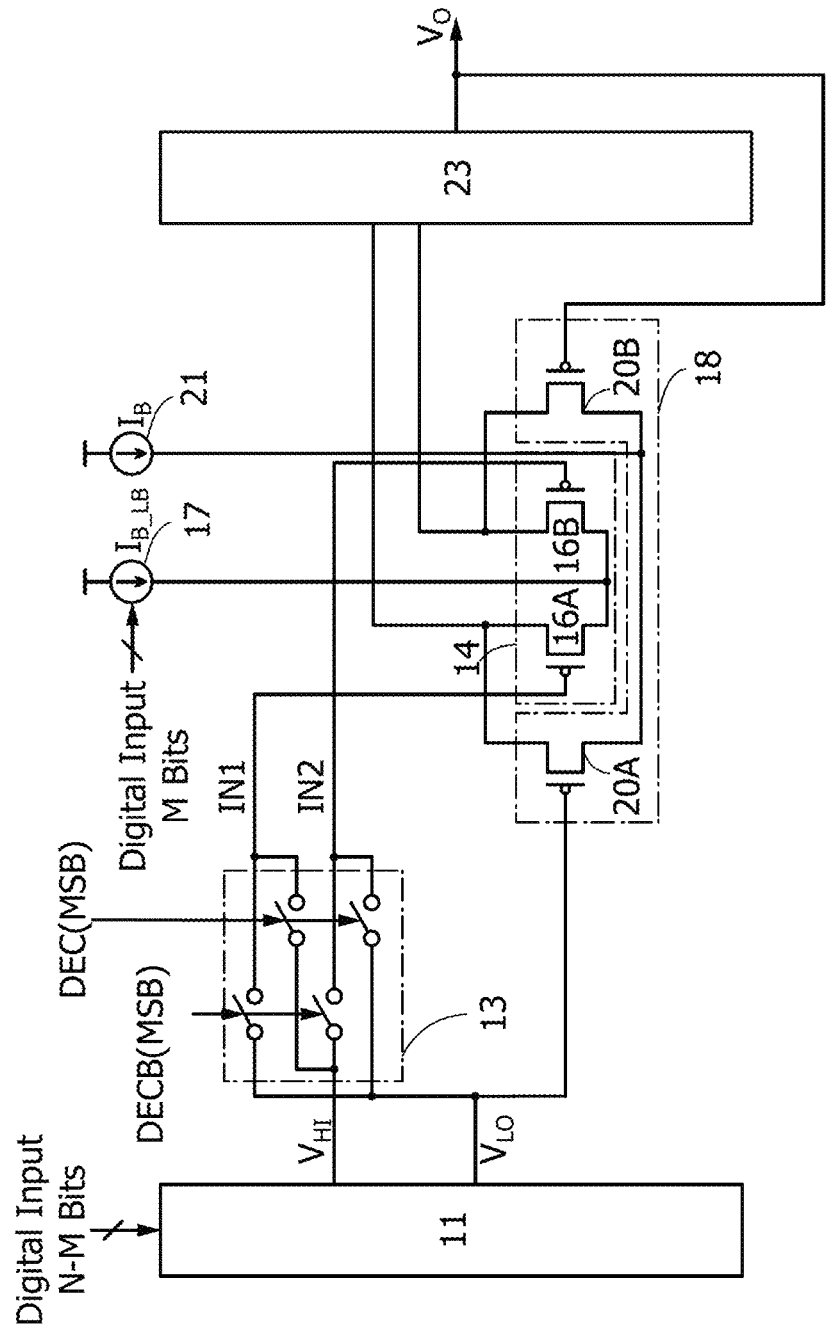
FIG. 19 is a circuit diagram illustrating one embodiment of the present invention.

The differential amplifier circuit 18 includes a transistor 20A and a transistor 20B. The differential amplifier circuit 18 can change the amount of current flowing between the differential amplifier circuit 18 and the current-voltage converter circuit 23 in accordance with a current $I_B$ flowing in the current source 21 and a difference between voltages supplied to gates of the transistors 20A and 20B. The differential amplifier circuit 18 is simply referred to as a circuit in some cases. Although the transistors 16A, 16B, 20A, and 20B are n-channel transistors, p-channel transistors may be used as in FIG. 19.

In the case where an N-bit digital signal is input to the semiconductor device 10, the current $I_{B\_LB}$ is a current corresponding to a lower M-bit digital signal. Accordingly, a current corresponding to the N-bit digital signal flows in the current-voltage converter circuit 23 on the basis of the voltage $V_{HI}$ and the voltage $V_{LO}$ based on the upper (N–M)-bit digital signal and the current $I_{B\_LB}$ based on the lower M-bit digital signal.

The current-voltage converter circuit 23 outputs a voltage corresponding to currents flowing in the differential amplifier circuits 14 and 18. This voltage is the output voltage $V_O$. The current-voltage converter circuit 23 is simply referred to as a circuit in some cases.

The switching circuit 13 includes a plurality of switches. The respective voltages $V_{HI}$ and $V_{LO}$ are input to either one of a terminal IN1 which is the gate of the transistor 16A and a terminal IN2 which is the gate of the transistor 16B in accordance with operation of the switches of the switching circuit 13. The switching operation of the switches is performed in accordance with the most significant bit of the lower bits of a digital signal and its inverted bit (DEC(MSB) and DECB(MSB)).

Because of the transistor characteristics of the transistors 16A, 16B, 20A, and 20B, offset voltages are added to voltages input to the differential amplifier circuits 14 and 18. Currents output from the differential amplifier circuits 14 and 18 fluctuate due to the offset voltages, resulting in fluctuation in the output voltage $V_O$. The output voltage $V_O$ is a grayscale voltage of a display device; therefore, the fluctuation in the currents output from the differential amplifier circuits 14 and 18 might cause a decrease in display quality, e.g., a desired grayscale voltage might not be obtained.

In one embodiment of the present invention, the switching circuit 13 operates so that the fluctuation in the current output from the differential amplifier circuit 14 due to the offset voltage is canceled. Moreover, the switching circuit 13 operates so that the fluctuation in the current output from the differential amplifier circuit 18 due to the offset voltage does not influence the output voltage $V_O$.

The switching circuit 13 switches its connection so that one of the voltage $V_{HI}$ and the voltage $V_{LO}$ is supplied to the terminal IN1 and the other thereof is supplied to the terminal IN2. Switching of the connection in the switching circuit 13 is performed in accordance with a most significant bit of the lower bits. Specifically, in the case where the most significant bit of the lower bits is "1", i.e., the inverted bit of the most significant bit of the lower bits is "0", the voltage $V_{HI}$ is supplied to the terminal IN1 and the voltage $V_{LO}$ is supplied to the terminal IN2. In the case where the most significant bit of the lower bits is "0", i.e., the inverted bit of the most significant bit of the lower bits is "1", the voltage $V_{HI}$ is supplied to the terminal IN2 and the voltage $V_{LO}$ is supplied to the terminal IN1.

With such a structure, the output voltage $V_O$ can be less influenced by the fluctuation in the current output from the differential amplifier circuit 14 due to the offset voltage. In the above-described structure, the switching circuit 13 switches its connection in accordance with data of the most significant bit of the lower bits, so that the maximum and minimum voltages expressed by the lower bits include the offset voltages. Accordingly, the output voltage $V_O$ including a voltage expressed by the lower bits can be less influenced by the offset voltages.

Accordingly, in the structure of one embodiment of the present invention, the influence of the offset voltages of the differential amplifier circuits 14 and 18 can be small. Thus, overlap and/or jump of the grayscale voltage due to the fluctuation in the output voltage $V_O$ can be suppressed. As a result, the display quality can be improved.

In the above-described structure, the voltage corresponding to an upper bit of a digital signal is generated in the D/A converter circuit 11, and the voltage corresponding to a lower bit of the digital signal is supplied to the current source 17. Thus, the voltage corresponding to the upper bit and the voltage corresponding to the lower bit are separately generated, the voltage corresponding to the lower bit is converted into a current, and respective currents are synthesized in the current-voltage converter circuit 23, so that a desired voltage can be generated.

The voltage generated in the D/A converter circuit 11 and the voltage supplied to the current source 17 are each generated using a plurality of resistors provided in series and a pass transistor logic. In the above structure, the number of resistors can be reduced because the upper-bit and lower-bit voltages are generated separately. In addition, the use of an R-DAC in conversion of the upper-bit and lower-bit voltages enables conversion with a short settling time and high response speed.

When a digital signal with a large number of bits is converted into an analog signal by an R-DAC, a large number of resistors are required. Therefore, a high power source voltage is needed. In this case, a high voltage needs to be supplied to each transistor in a pass transistor logic to operate as a switch. Accordingly, transistors with high withstand voltage are required for the pass transistor logic. However, in one embodiment of the present invention, as described above, the number of resistors can be reduced, resulting in a smaller power source voltage. Thus, each transistor in the pass transistor logic can operate as a switch even when a voltage supplied is not so high. In this case, each transistor in the pass transistor logic does not need to have high withstand voltage, leading to a reduction in size of the transistor. Accordingly, it is possible to suppress an increase in parasitic capacitance, achieve a smaller circuit area, and increase the response speed.

Although the differential amplifier circuits 14 and 18 are used for describing the operation principal of the structure in FIG. 1, transconductance amplifiers may be used instead of the differential amplifier circuits. Such a structure is shown in FIG. 2.

Figure 2:
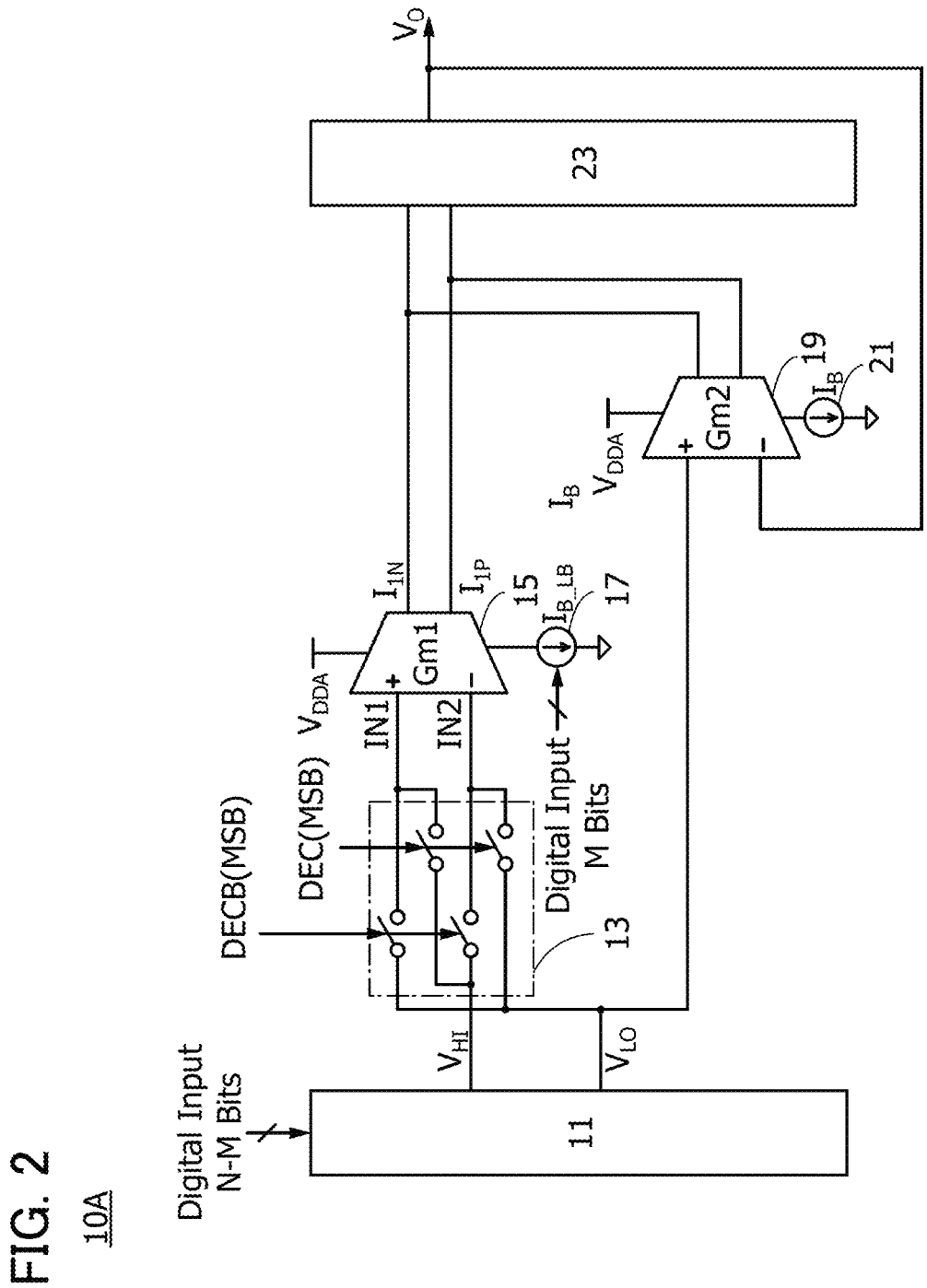
FIG. 2 is a circuit diagram illustrating one embodiment of the present invention.

A semiconductor device 10A in FIG. 2 includes the D/A converter circuit 11, a transconductance amplifier 15, the current source 17, a transconductance amplifier 19, the current source 21, the switching circuit 13, and the current-voltage converter circuit 23.

The transconductance amplifier 15 is also represented by a first Gm amplifier or a Gm1 in some cases. The transconductance amplifier 19 is also represented by a second Gm amplifier or a Gm2 in some cases.

A transconductance amplifier outputs current proportional to a difference between two input voltages. For example, currents output from the transconductance amplifier 15 in accordance with a difference in voltage between the terminal IN1 and the terminal IN2 are denoted by a current $I_{1N}$ and a current $I_{1P}$ in FIG. 2. Also in FIG. 2, a voltage supplied to the transconductance amplifiers 15 and 19 is a voltage $V_{DDA}$. The voltage $V_{DDA}$ is a voltage which is supplied so that the transconductance amplifiers 15 and 19 output currents.

The structure illustrated in FIG. 2 is used in the following description.

<Operation of Semiconductor Device>

A specific example of operation of the semiconductor device 10A in FIG. 2 is described for explaining an effect of one embodiment of the present invention.

Figure 3:
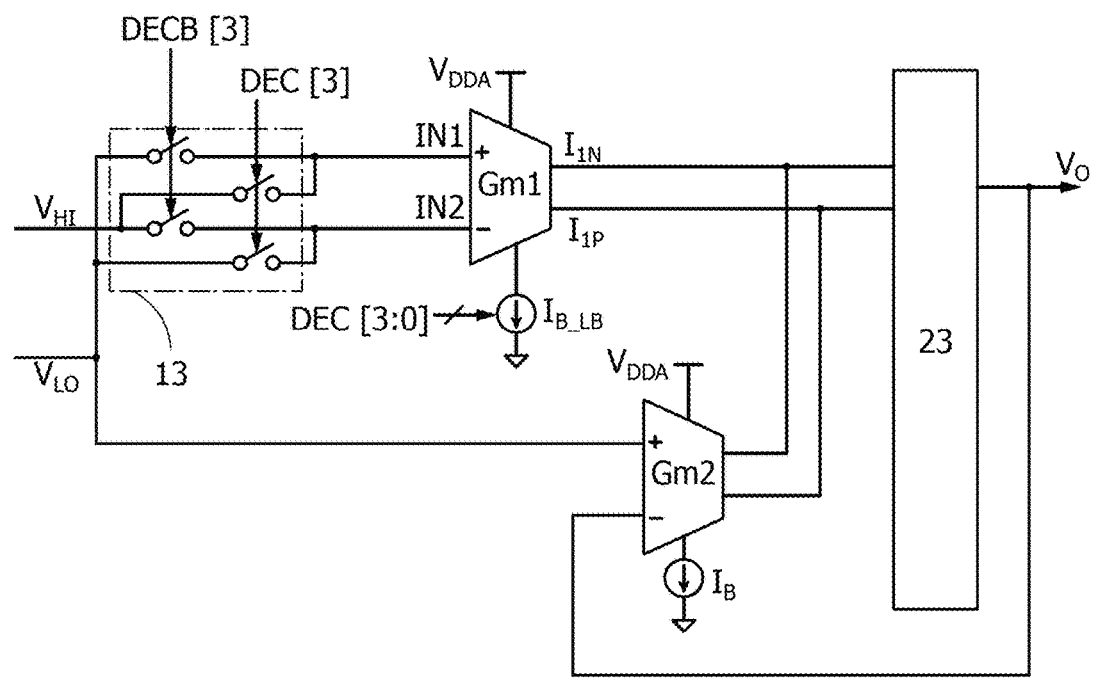
FIG. 3 is a circuit diagram illustrating one embodiment of the present invention.

A circuit diagram in FIG. 3 illustrates the case where M in FIG. 2 is 4, i.e., the case where the lower bits are four bits. In FIG. 3, the most significant bit of the lower bits is denoted by data DEC[3] and the inverted bit thereof is denoted by data DECB[3]. The example in FIG. 3 illustrates the case where there is no offset voltage in each transconductance amplifier.

Figure 4A:
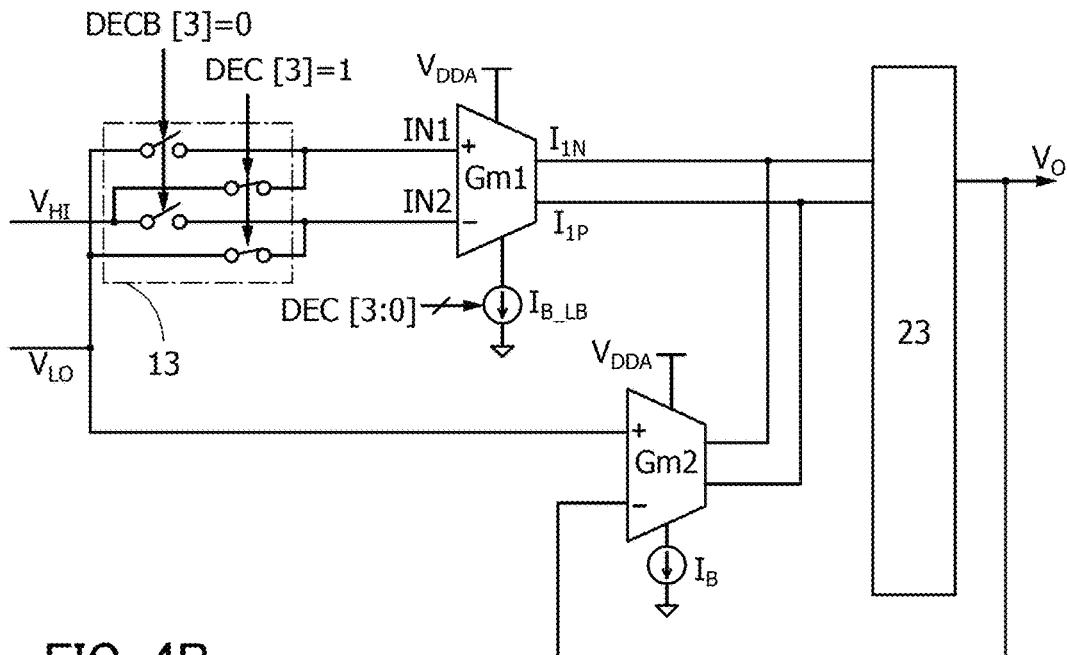
FIGS. 4A and 4B are circuit diagrams each illustrating one embodiment of the present invention.

As described above, in the case where the most significant bit of the lower bits is "1" (data DEC[3]=1), i.e., the inverted bit of the most significant bit of the lower bits is "0" (data DECB[3]=0), the switching circuit 13 supplies the voltage $V_{HI}$ to the terminal IN1 and the voltage $V_{LO}$ to the terminal IN2. FIG. 4A illustrates the connection state of the switching circuit 13 in this case.

Figure 4B:
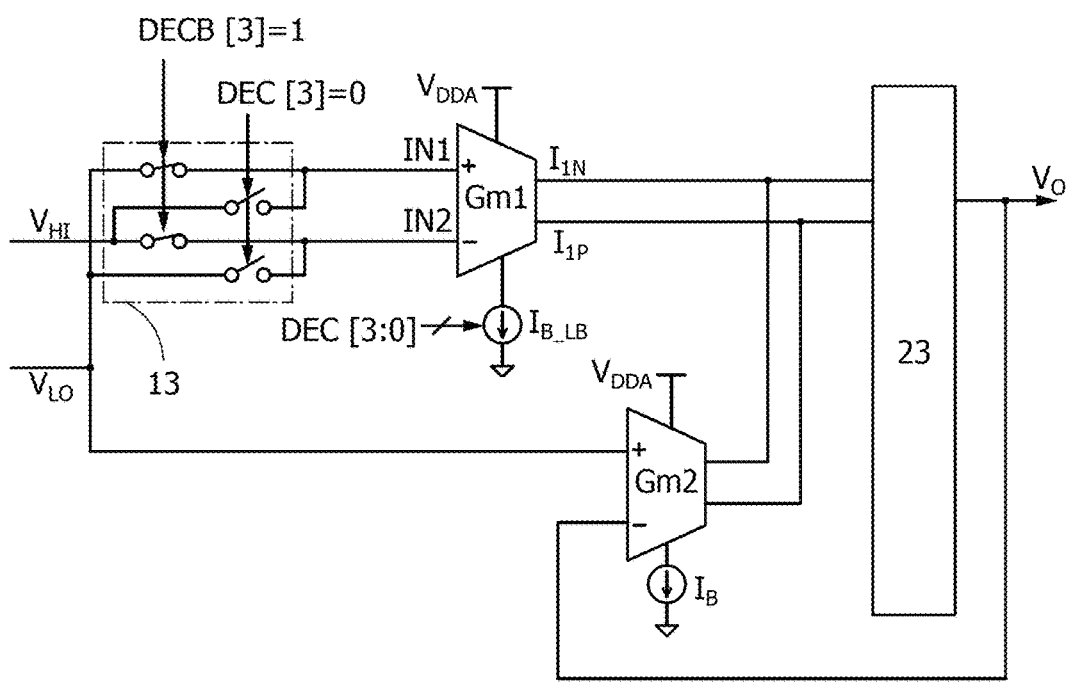

In the case where the most significant bit of the lower bits is "0" (data DEC[3]=0), i.e., the inverted bit of the most significant bit of the lower bits is "1" (data DECB[3]=1), the switching circuit 13 supplies the voltage $V_{HI}$ to the terminal IN2 and the voltage $V_{LO}$ to the terminal IN1. FIG. 4B illustrates the connection state of the switching circuit 13 in this case.

With such a structure, the output voltage $V_O$ can be less influenced by the fluctuation in the current output from the transconductance amplifier 15 due to the offset voltage. In the above-described structure, the switching circuit 13 switches its connection in accordance with data of the most significant bit of the lower bits, so that the maximum and minimum voltages expressed by the lower bits include the offset voltages. Accordingly, the output voltage $V_O$ including a voltage expressed by the lower bits can be less influenced by the offset voltages.

Note that the current value of the current $I_{B\_LB}$ determined by the current source 17 and flowing through the transconductance amplifiers 15 changes in accordance with the lower four bits. The amounts of the currents $I_{1N}$ and $I_{1P}$ output from the transconductance amplifier 15 can be adjusted in accordance with the change in this current value and the output voltage $V_O$ including a voltage expressed by the lower bits can be obtained.

Figure 5:
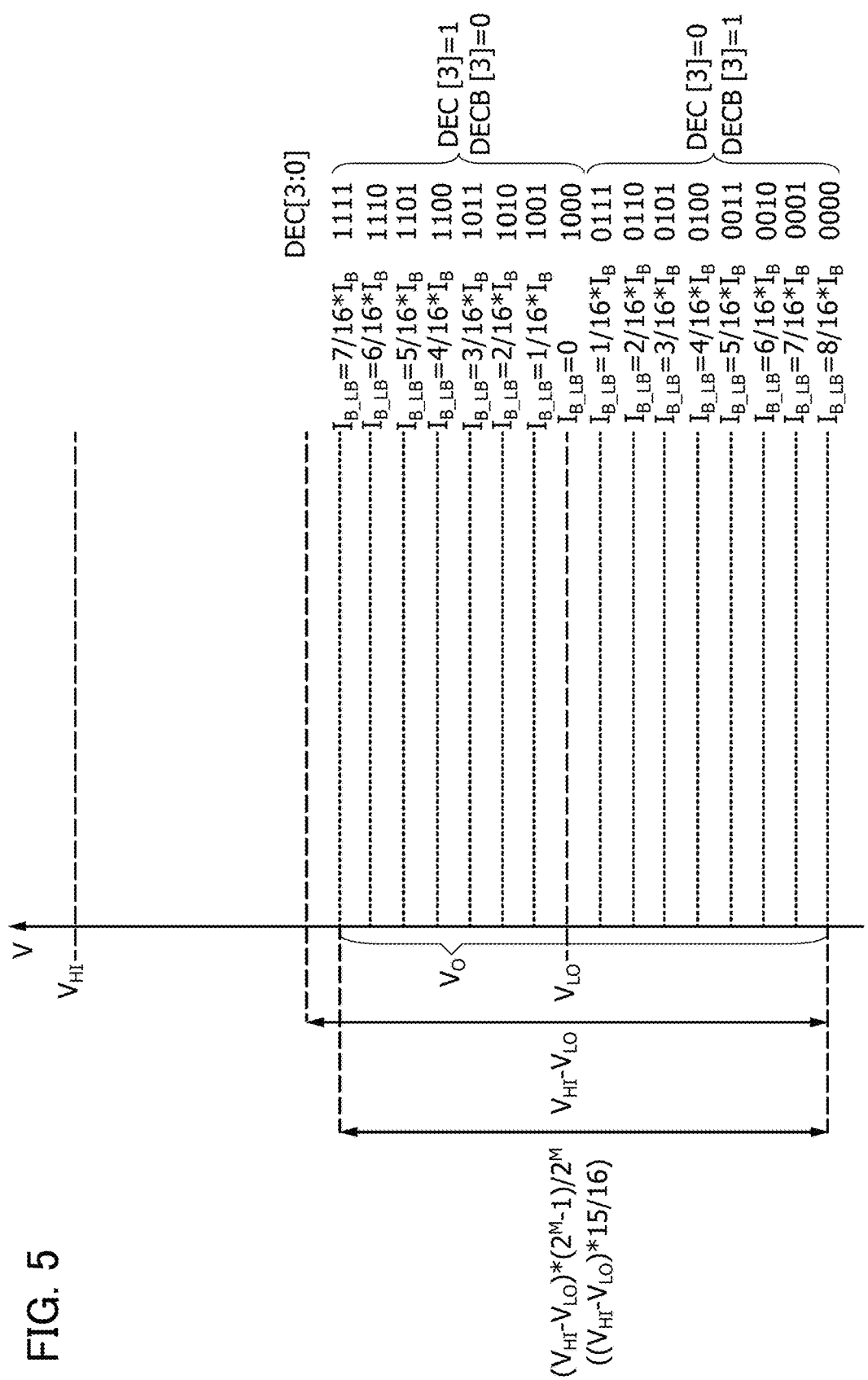
FIG. 5 illustrates one embodiment of the present invention.

FIG. 5 is a schematic view illustrating the distribution of voltages used for expressing grayscale, based on the changes in the current $I_{B\_LB}$ flowing in the current source 17. As illustrated in FIG. 5, with the use of the voltage $V_{LO}$ determined in accordance with the upper bits as a reference, increase or decrease of the current $I_{B\_LB}$ is determined in accordance with the most significant bit of the lower bits and its inverted bit (DEC[3] and DECB[3]). Moreover, four-bit (16-grayscale) multiple output voltages $V_O$ can be obtained in accordance with the amount of the current $I_{B\_LB}$ corresponding to the three bits except the most significant bit of the lower bits.

Note that a 16-level voltage based on the lower-bit data is obtained from $(V_{HI}-V_{LO})\times\{(2^M-1)/2^M\}$ which is lower than the difference between the voltages $V_{HI}$ and $V_{LO}$ ($V_{HI}-V_{LO}$), which are determined in accordance with the upper bits. In the case where M is 4, the 16-level voltage is obtained from $(V_{HI}-V_{LO})\times(15/16)$. Thus, duplication of the output voltage obtained when the upper bits change by 1 can be eliminated. Thus, overlap and/or jump of the grayscale voltage due to the fluctuation in the output voltage $V_O$ can be suppressed. As a result, the display quality can be improved.

Figure 6:
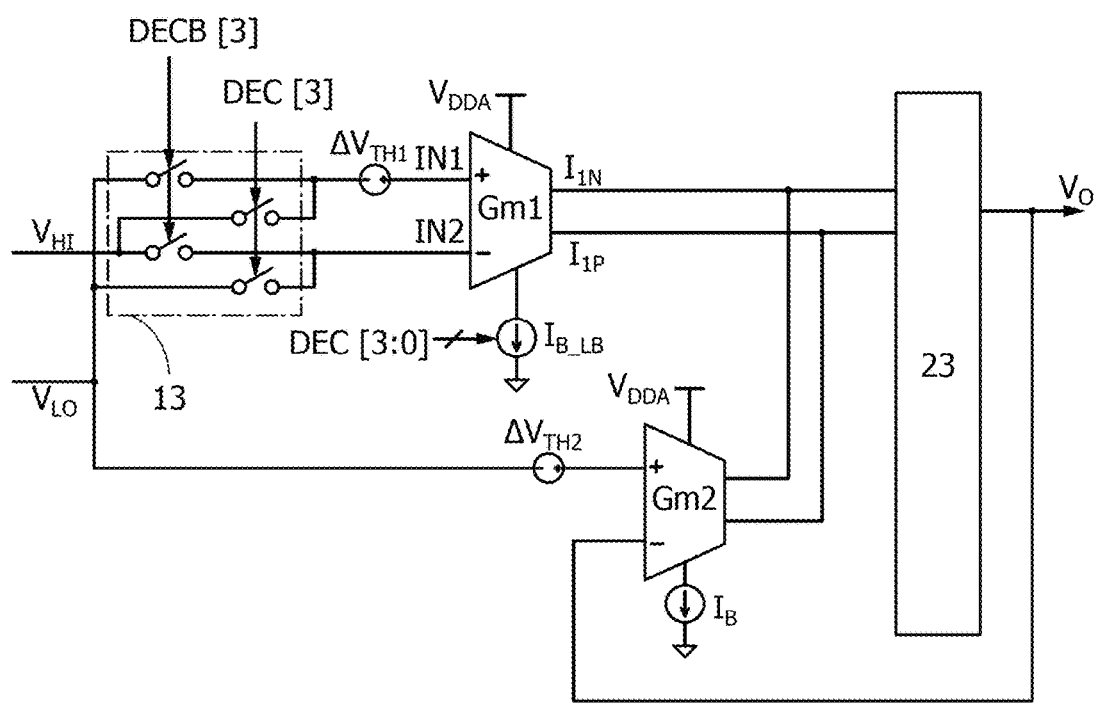
FIG. 6 is a circuit diagram illustrating one embodiment of the present invention.

A circuit diagram in FIG. 6 illustrates the case where there is an offset voltage in each transconductance amplifier in the circuit diagram in FIG. 3. FIG. 6 illustrates the case where an offset voltage $\Delta V_{TH1}$ exists in the terminal IN1 of the transconductance amplifier 15. Also in FIG. 6, an offset voltage $\Delta V_{TH2}$ exists in a terminal of the transconductance amplifier 19, to which the voltage $V_{LO}$ is input.

The offset voltage $\Delta V_{TH1}$ of the transconductance amplifier 15 can be canceled by switching of the switching circuit 13.

Figure 7:
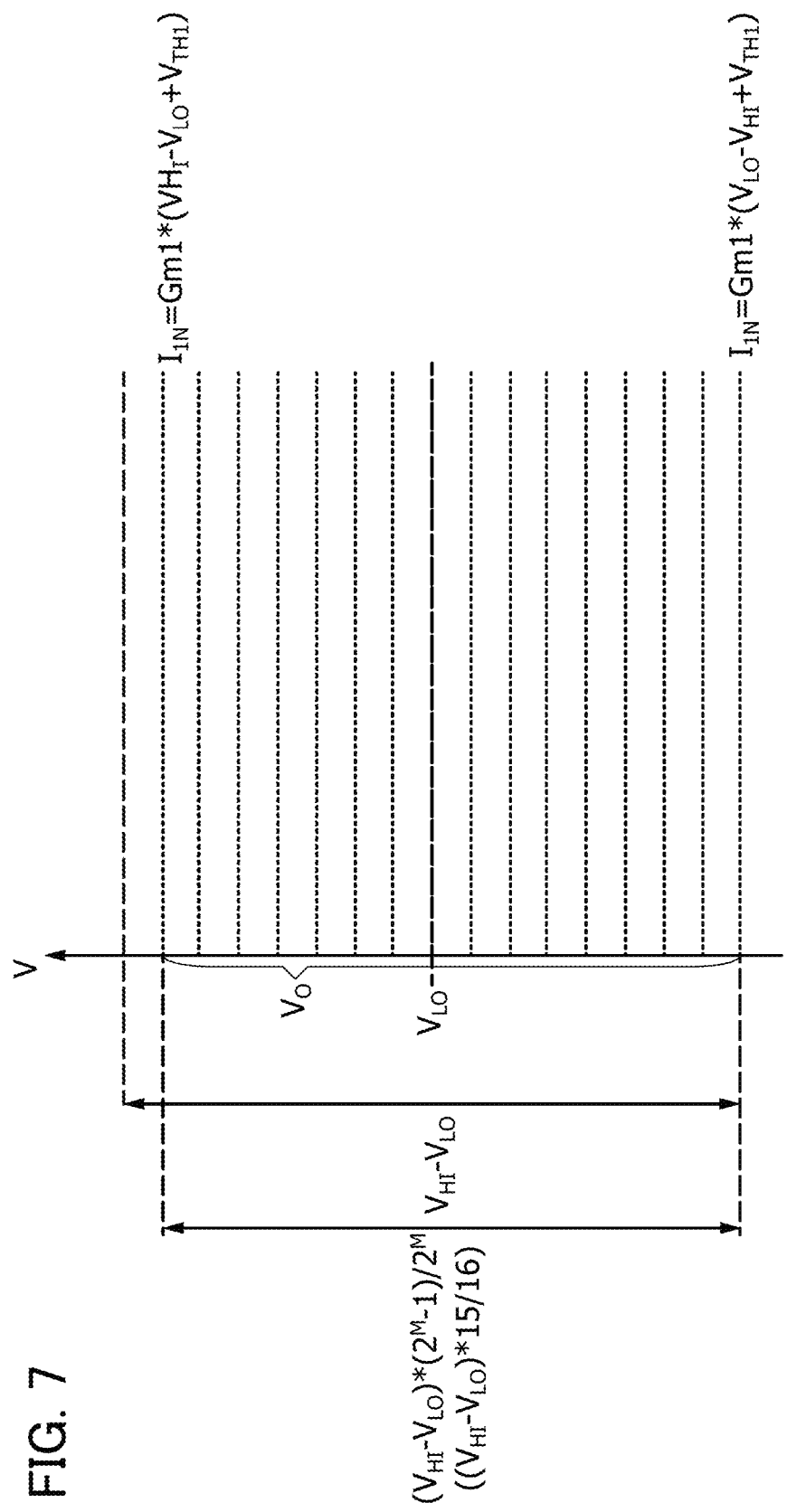
FIG. 7 illustrates one embodiment of the present invention.

In other words, in the case where the most significant bit of the lower bits is "1" (data DEC[3]=1) and the inverted bit thereof is "0" (data DECB[3]=0), i.e., the voltage $V_{HI}$ is input to the terminal IN1, the switching circuit 13 can operate so that the output current $I_{1N}$ of the transconductance amplifier 15 is $I_{1N}=Gm1\times(V_{HI}-V_{LO}+\Delta V_{TH1})$ as illustrated in FIG. 7. Note that Gm1 here denotes the amplification factor of the transconductance amplifier 15.

Similarly, in the case where the most significant bit of the lower bits is "0" (data DEC[3]=0) and the inverted bit thereof is "1" (data DECB[3]=1), i.e., the voltage $V_{LO}$ is input to the terminal IN1, the switching circuit 13 can operate so that the output current $I_{1N}$ of the transconductance amplifier 15 is $I_{1N}=Gm1\times(V_{LO}-V_{HI}+\Delta V_{TH1})$ as illustrated in FIG. 7.

The voltage expressed by the lower bits that influences the fluctuation in the output voltage $V_O$ is determined in accordance with a difference between the maximum value and minimum value of the output current $I_{1N}$, i.e., the difference between two output currents $I_{1N}$ obtained by switching of the switching circuit 13 (deference between $Gm1\times(V_{HI}-V_{LO}+\Delta V_{TH1})$ and $Gm1\times(V_{LO}-V_{HI}+\Delta V_{TH1})$). The output voltage $V_O$ including the voltage expressed by the lower bits and determined in accordance with the difference between two output currents $I_{1N}$ can be obtained without including the offset voltage $\Delta V_{TH1}$. Thus, by changing the output current $I_{1N}$ by switching of the switching circuit 13, the influence of the offset voltage $\Delta V_{TH1}$ can be reduced.

The voltage $V_O$ is determined with the use of the voltage $V_{LO}$ determined in accordance with the upper bits as a reference. Although the offset voltage $\Delta V_{TH2}$ is necessarily added to the output voltage $V_O$, the accuracy of the lower bits is less influenced by the offset voltage $\Delta V_{TH2}$ of the transconductance amplifier 19.

As described above, with the structure of one embodiment of the present invention, the semiconductor device 10 can operate so that the output voltage $V_O$ is hardly influenced by the offset voltages of the transconductance amplifiers 15 and 19. Accordingly, the output voltage $V_O$ is not influenced by the offset voltages and overlap and jump of the grayscale voltage are suppressed, leading to an improvement of display quality.

Next, the circuits constituting the semiconductor device 10A will be described.

<D/A Converter Circuit 11>

Figure 8:
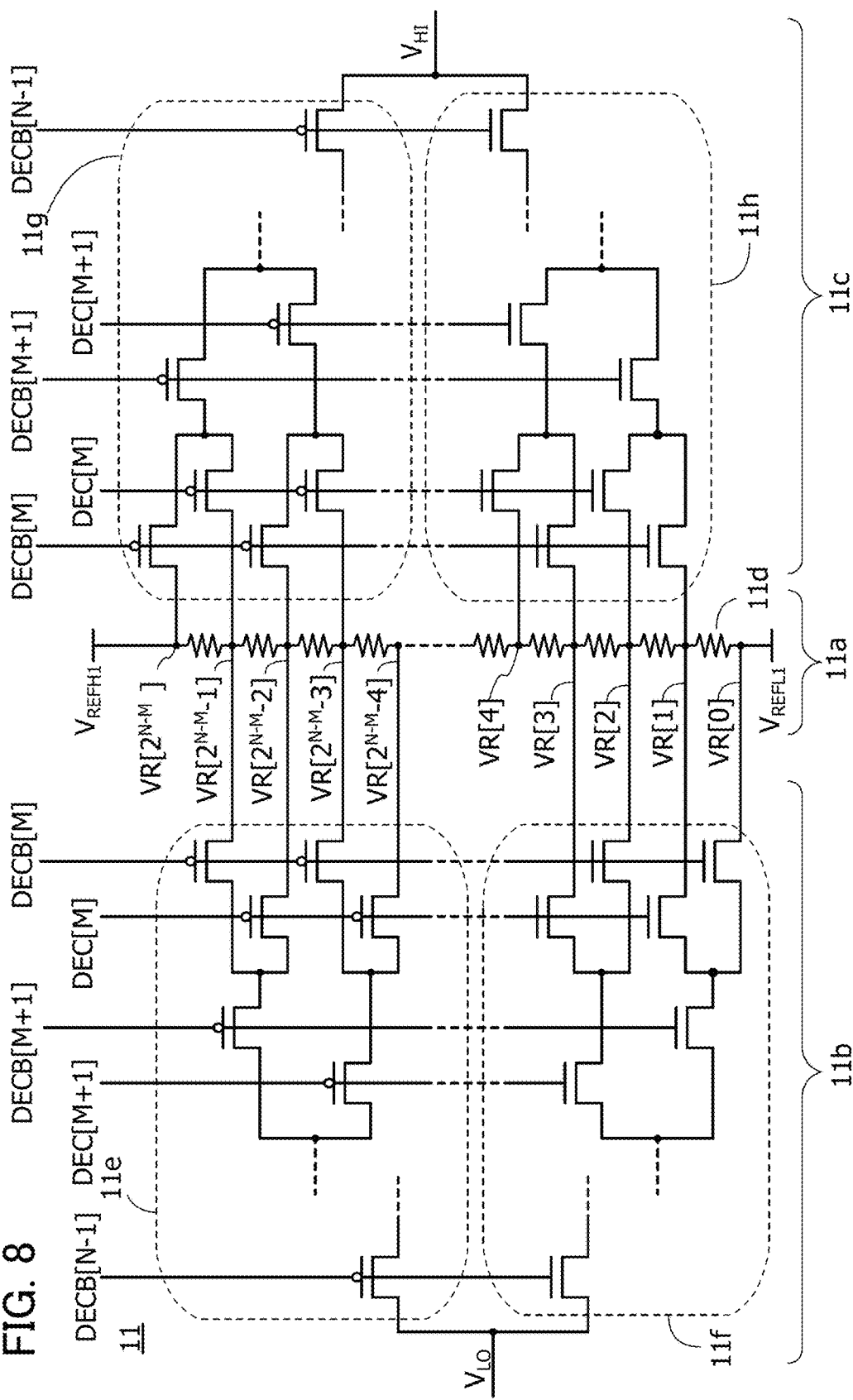
FIG. 8 is a circuit diagram illustrating one embodiment of the present invention.

The D/A converter circuit 11 in FIG. 8 includes a voltage generation circuit 11a, a pass transistor logic (PTL) 11b, and a PTL 11c.

The voltage generation circuit 11a includes a plurality of resistors 11d. The voltage generation circuit 11a is supplied with voltages $V_{REFH1}$ and $V_{REFL1}$ ($V_{REFH1}>V_{REFL1}$) to generate a plurality of voltages VR[0] to VR[$2^{N-M}$].

The PTL 11b includes a plurality of p-channel transistors 11e and a plurality of n-channel transistors 11f. The PTL 11c includes a plurality of p-channel transistors 11g and a plurality of n-channel transistors 11h. Among the voltages VR[0] to VR[$2^{N-M}$], the voltages VR[$2^{N-M}$/2] to VR[$2^{N-M}$−1] are input to the transistors 11e, the voltages VR[0] to VR[($2^{N-M}$/2)−1] are input to the transistors 11f, the voltages VR[($2^{N-M}$/2)+1] to VR[$2^{N-M}$] are input to the transistors 11g, and the voltages VR[1] to VR[$2^{N-M}$/2] are input to the transistors 11h.

The transistors 11e to 11h are pass transistors and function as switches. Each of the switches is switched on or off in accordance with an upper-bit signal. The PTL 11b and the PTL 11c each have a function of selecting a desired voltage among the voltages VR[0] to VR[$2^{N-M}$−1] to output by switching of the switches. The PTL 11b has a function of outputting the voltage $V_{LO}$ and the PTL 11c has a function of outputting the voltage $V_{HI}$. The voltages $V_{HI}$ and $V_{LO}$ are analog voltages based on an upper-bit signal. As described above, the voltages $V_{HI}$ and $V_{LO}$ are converted into voltages based on a lower-bit signal in a circuit in a later stage.

The D/A converter circuit 11 is an R-DAC including resistors provided in series. Although an R-DAC can perform D/A converter at high speed, an increase in the number of bits of a digital signal causes an increase in an area occupied by the circuit. However, in the semiconductor device 10 of one embodiment of the present invention, only an upper-bit signal of digital signals is allocated to the R-DAC, so that the area occupied by the circuit can be reduced.

<Transconductance Amplifier 15 and Current Source 17>

Figure 9:
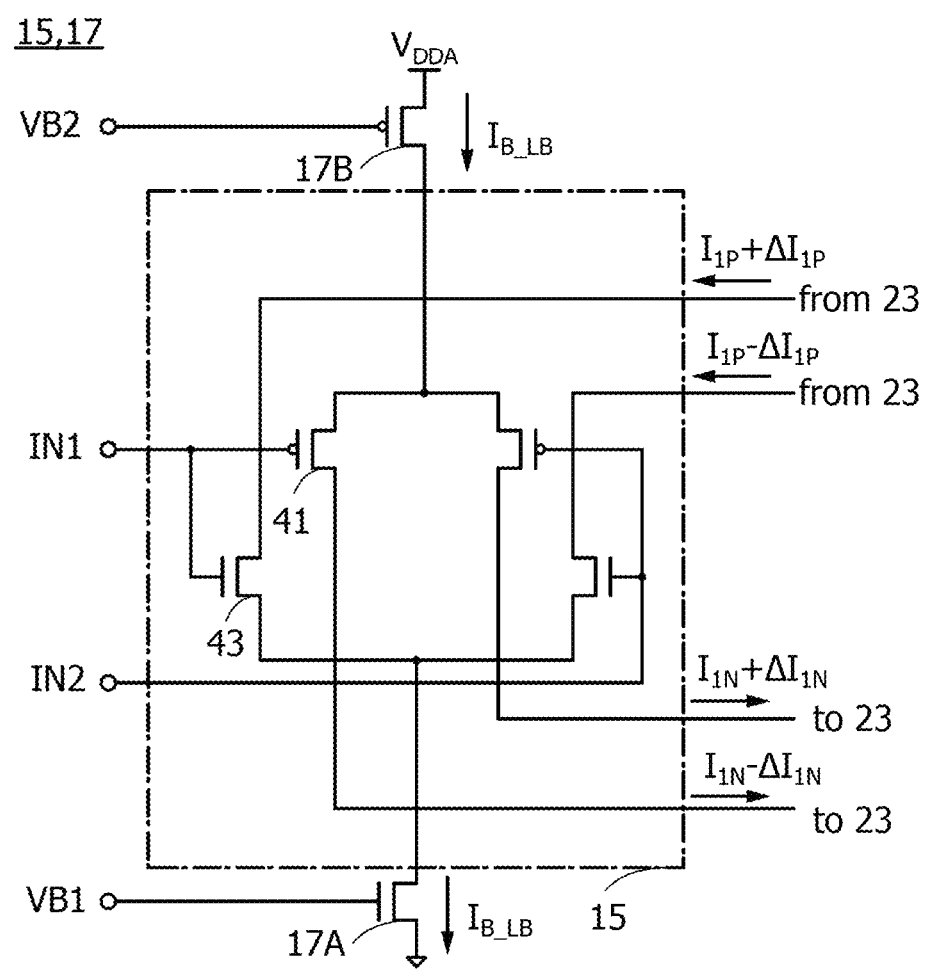
FIG. 9 is a circuit diagram illustrating one embodiment of the present invention.

In the transconductance amplifier 15 illustrated in FIG. 9, one of the voltages $V_{HI}$ and $V_{LO}$ is input to the terminal IN1 and the other thereof is input to IN2. The transconductance amplifier 15 in FIG. 9 outputs the currents $I_{1N}$ and $I_{1P}$ in accordance with the current $I_{B\_LB}$ flowing through transistors 17A and 17B. The transistors 17A and 17B correspond to the current source 17 illustrated in FIG. 2.

The transconductance amplifier 15 illustrated in FIG. 9 has a circuit structure of a differential amplifier circuit. The transconductance amplifier 15 includes p-channel transistors 41 and n-channel transistors 43. The transistors 41 and 43 make the currents $I_{1N}$ and $I_{1P}$ flow in accordance with voltages VB1 and VB2, and currents $I_{1N}+\Delta I_{1N}$, $I_{1N}-\Delta I_{1N}$, $I_{1P}+\Delta I_{1P}$, and $I_{1P}-\Delta I_{1P}$ flow between the transconductance amplifier 15 and the current-voltage converter circuit 23 in accordance with the difference between the voltages $V_{HI}$ and $V_{LO}$.

The currents $I_{1N}+\Delta I_{1N}$, $I_{1N}-\Delta I_{1N}$, $I_{1P}+\Delta I_{1P}$, and $I_{1P}-\Delta I_{1P}$ depend on the voltages $V_{HI}$ and $V_{LO}$ and the current $I_{B\_LB}$. The currents $I_{1N}+\Delta I_{1N}$, $I_{1N}-\Delta I_{1N}$, $I_{1P}+\Delta I_{1P}$, and $I_{1P}-\Delta I_{1P}$ are converted into voltages corresponding to digital signals in a circuit in a later stage.

The voltages VB1 and VB2 correspond to lower-bit digital signals and can be generated by a D/A converter circuit and a bias voltage generation circuit supplied with lower-bit digital signals.

Figure 10:
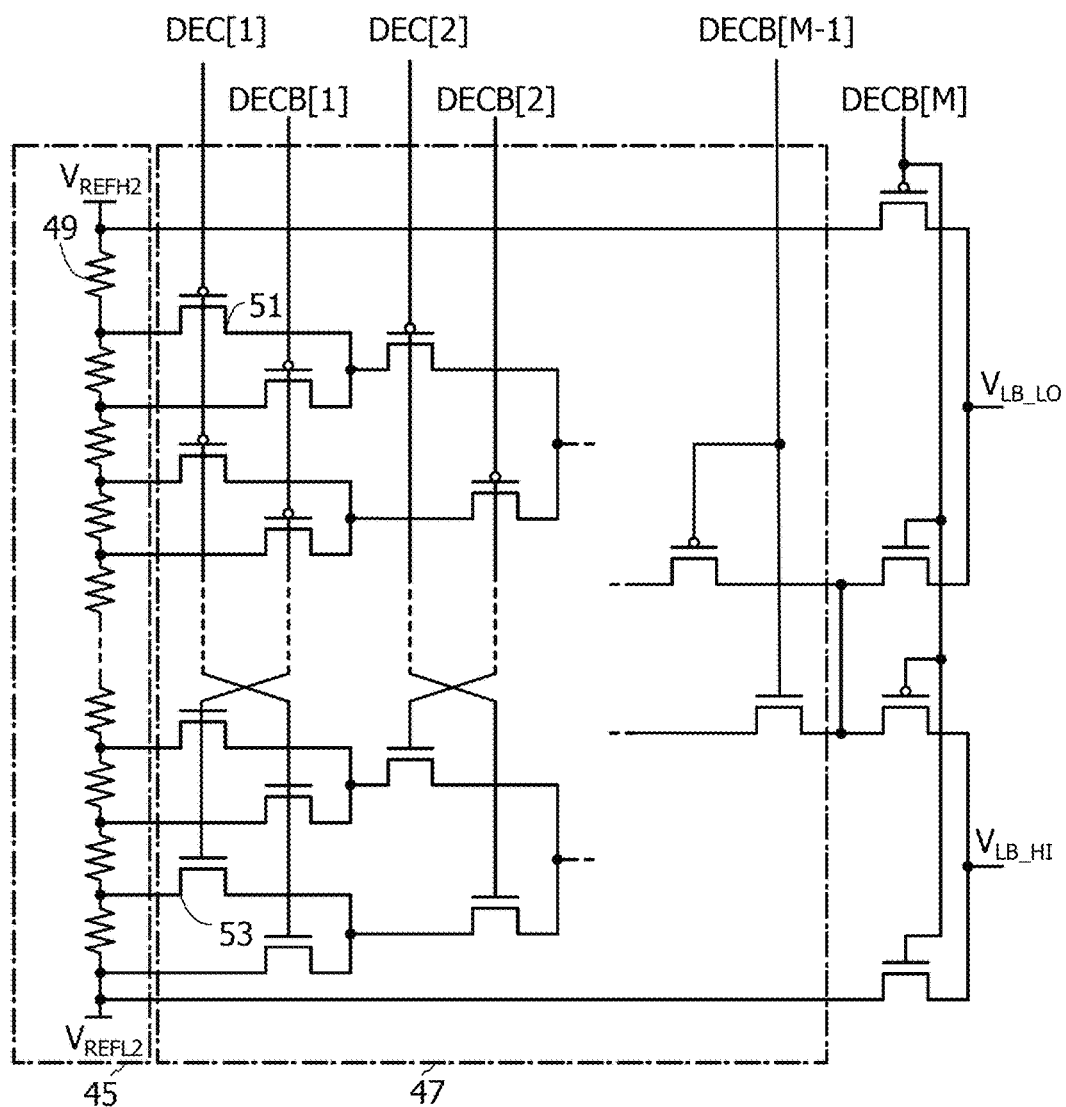
FIG. 10 is a circuit diagram illustrating one embodiment of the present invention.

FIG. 10 illustrates an example of a D/A converter circuit for generating the voltages VB1 and VB2. The D/A converter circuit illustrated in FIG. 10 includes a voltage generation circuit 45 and a PTL 47.

The voltage generation circuit 45 includes a plurality of resistors 49. The voltages generation circuit 45 is supplied with voltages $V_{REFH2}$ and $V_{REFL2}$ ($V_{REFH1}>V_{REFH2}$, $V_{REFH2}>V_{REFL2}$) to generate a plurality of voltages.

The PTL 47 includes a plurality of p-channel transistors 51 and a plurality of n-channel transistors 53. The transistors 51 and 53 are pass transistors and function as switches. Each of the switches is switched on or off in accordance with lower-bit digital signals DEC[1] to DEC[M], and digital signals DECB[1] to DECB[M] which are inverted signals thereof. The PTL 47 has a function of selecting a desired voltage among a plurality of voltages generated in the voltage generation circuit 45 to output by switching of the switches. The voltages $V_{LB\_HI}$ and $V_{LB\_LO}$ output from the PTL 47 are voltages for generating the voltages VB1 and VB2 for making the currents $I_{1N}$ and $I_{1P}$ corresponding to lower-bit digital signals flow.

Figure 11:
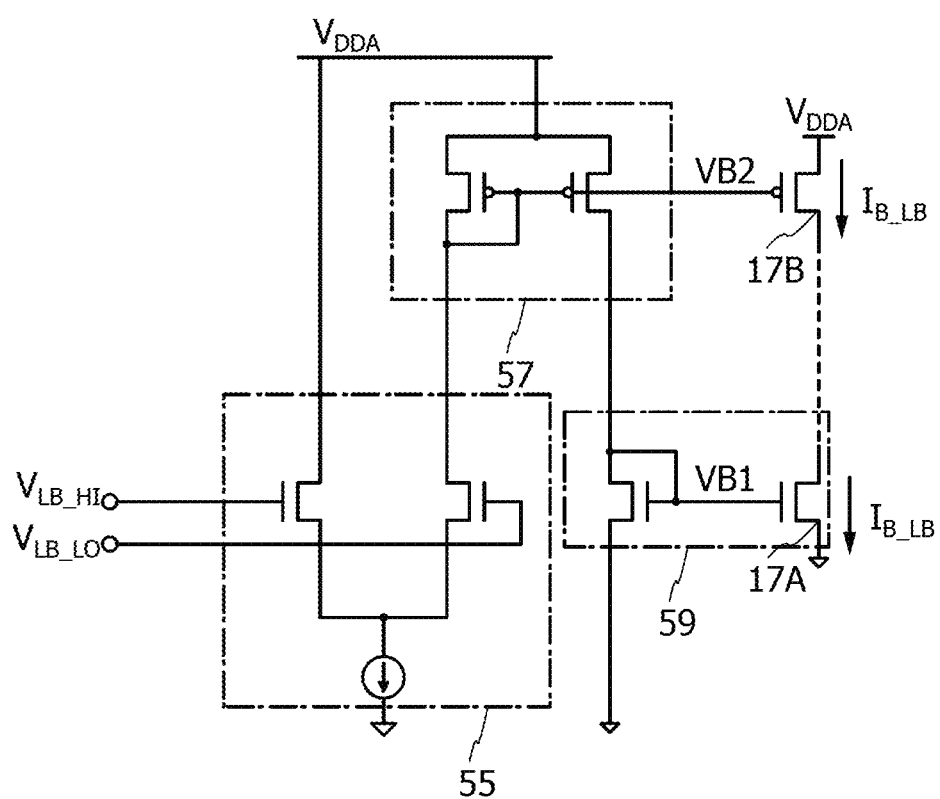
FIG. 11 is a circuit diagram illustrating one embodiment of the present invention.

FIG. 11 illustrates an example of a bias voltage generation circuit for generating the voltages VB1 and VB2. The bias voltage generation circuit in FIG. 11 includes a differential amplifier circuit 55, a current mirror circuit 57, and a current mirror circuit 59. The differential amplifier circuit 55 generates a current on the basis of the voltages $V_{LB\_HI}$ and $V_{LB\_LO}$. The current mirror circuits 57 and 59 operate so that the generated current flows; thus, the voltages VB1 and VB2 can be generated. The voltages VB1 and VB2 are supplied to the transistors 17A and 17B, respectively, and thus, the current $I_{B\_LB}$ based on the voltages $V_{LB\_HI}$ and $V_{LB\_LO}$, i.e., the lower-bit digital signal can flow.

<Transconductance Amplifier 19, Current Source 21, and Current-Voltage Converter Circuit 23>

Figure 12:
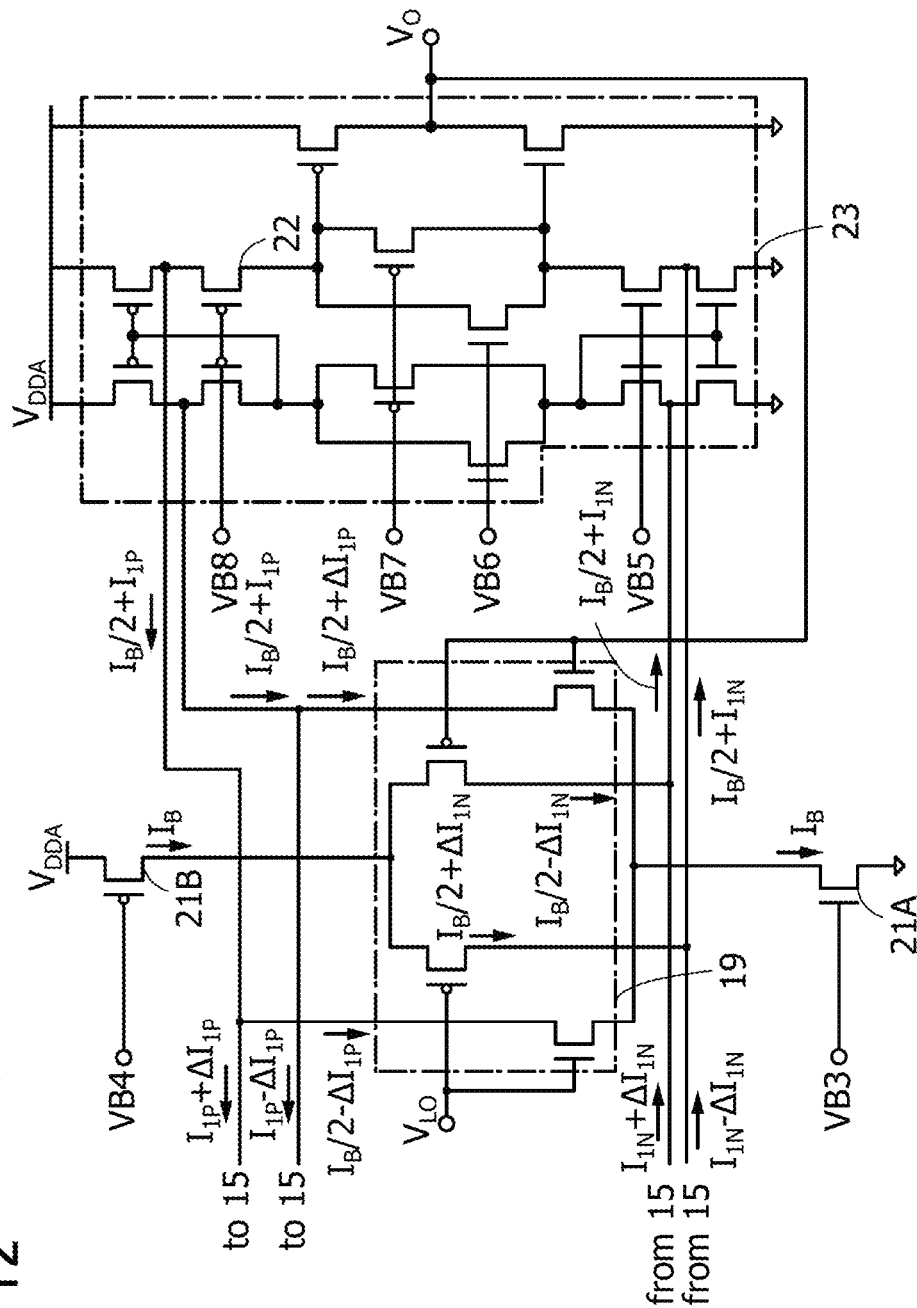
FIG. 12 is a circuit diagram illustrating one embodiment of the present invention.

In the transconductance amplifier 19 in FIG. 12, the voltages $V_O$ and $V_{LO}$ are input to input terminals. When bias voltages VB3 and VB4 are supplied to transistors 21A and 21B included in the current source 21, a constant current $I_B$ flows through the transconductance amplifier 19. In the transconductance amplifier 19, output currents, i.e., a current $I_B/2+\Delta I_{1N}$ and a current $I_B/2-\Delta I_{1N}$ are changed in accordance with the difference between the voltages $V_O$ and $V_{LO}$. In FIG. 12, the currents flowing between the circuits are indicated using arrows.

In the current-voltage converter circuit 23, a constant current flows when bias voltages VB5 to VB8 are supplied to transistors 22 included in the current-voltage converter circuit 23, and the voltage $V_O$ is output in accordance with a current $I_B/2+I_{1P}$ and a current $I_B/2+I_{1N}$, i.e., the output currents of the transconductance amplifier 19.

The current-voltage converter circuit 23 can generate the voltage $V_O$ serving as a grayscale voltage that is an analog voltage corresponding to the original digital signal by changing the currents $I_B/2+I_{1P}$ and the currents $I_B/2+I_{1N}$. The currents $I_B/2+I_{1P}$ are obtained by synthesizing the current $I_{1P}+\Delta I_{1P}$ and the current $I_B/2-\Delta I_{1P}$, and the current $I_{1P}-\Delta I_{1P}$ and the current $I_B/2+\Delta I_{1P}$. The currents $I_B/2+I_{1N}$ are obtained by synthesizing the current $I_{1N}+\Delta I_{1N}$ and the current $I_B/2-\Delta I_{1N}$, and the current $I_{1N}-\Delta I_{1N}$ and the current $I_B/2+\Delta I_{1N}$.

SUMMARY

As described above, in the structure in this embodiment, when a current corresponding to a lower-bit grayscale voltage is generated in the transconductance amplifier, the voltages $V_{HI}$ and $V_{LO}$ supplied to the transconductance amplifier are input to the two input terminals in accordance with a digital signal of the most significant bit of lower bits. Since a change corresponding to the offset voltage is added to both the maximum and minimum values of the current output from the transconductance amplifier, the fluctuation in the grayscale voltage due to the offset voltage can be suppressed.

Embodiment 2

Figure 13:
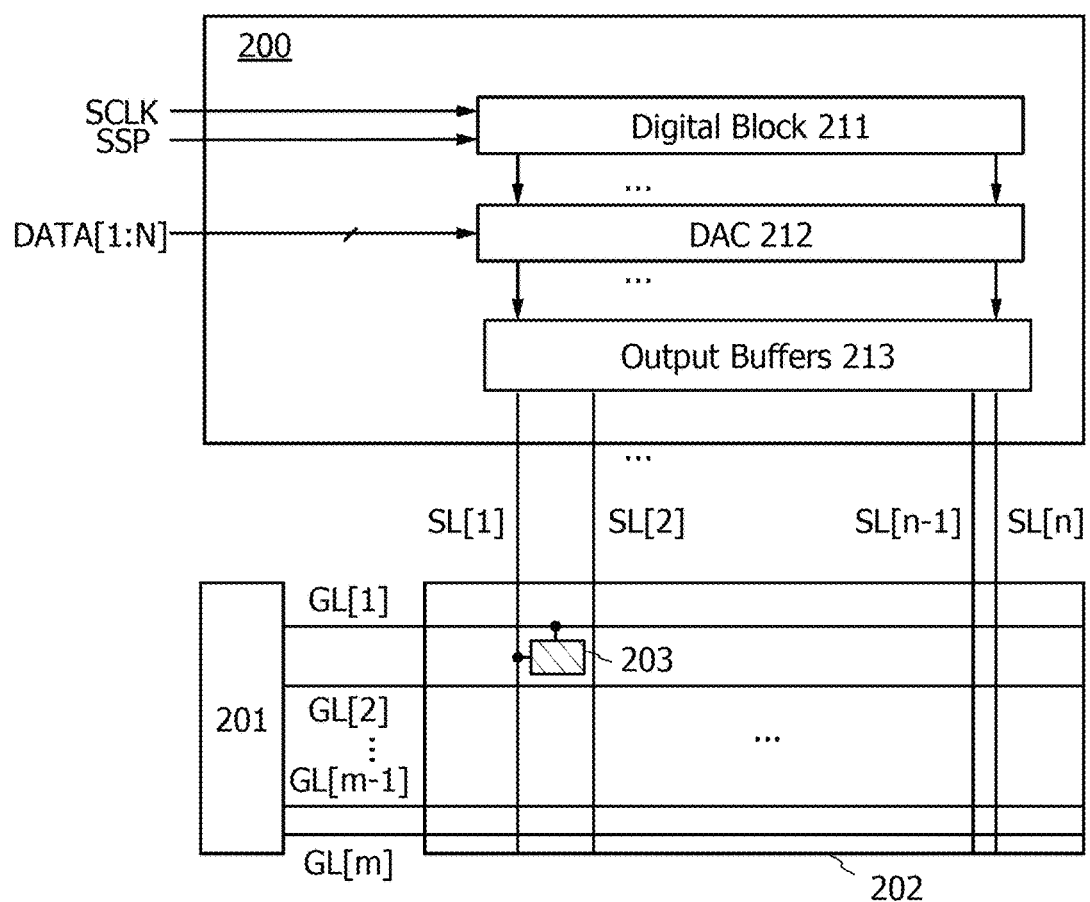
FIG. 13 is a block diagram illustrating one embodiment of the present invention.

This embodiment will explain a circuit block diagram of a display device including the semiconductor device described in Embodiment 1, which functions as a grayscale voltage generation circuit. FIG. 13 is a circuit block diagram illustrating a source driver, a gate driver, and a display portion.

The display device in the circuit block diagram of FIG. 13 includes a source driver 200, a gate driver 201, and a display portion 202. In FIG. 13, a pixel 203 is shown in the display portion 202.

The source driver 200 can include the semiconductor device described in Embodiment 1. Specifically, the source driver 200 includes a digital circuit portion 211 (denoted by Digital Block in the diagram), a D/A converter 212 (denoted by DAC in the diagram), and an output circuit portion 213 (denoted by Output Buffers in the diagram).

The source driver 200 has a function of outputting an analog signal to source lines SL[1] to SL[n] (n is a natural number of 2 or more).

The digital circuit portion 211 includes a shift register and the like. The digital circuit portion 211 receives a source clock signal SCLK and a source start pulse SSP, for example. The shift register generates a sampling pulse.

The D/A converter 212 is the same as the semiconductor device described in Embodiment 1. That is, the D/A converter 212 has the same structure as the semiconductor device 10 or the semiconductor device 10A in Embodiment 1. With such a structure, reduction in a circuit area and improvement in display quality can be achieved. Digital signals DATA[1] to DATA[N] ([1:N] in the diagram) are input to the D/A converter 212, for example. The digital signals DATA[1] to DATA[N] are converted into analog signals. The converted analog signals are output to the output circuit portion 213 in accordance with the sampling pulse.

The output circuit portion 213 includes a buffer and the like. The output circuit portion 213 has a function of outputting amplified analog signals to the source lines SL[1] to SL[n].

The gate driver 201 includes a shift register and a buffer, for example. The gate driver 201 receives a gate start pulse, a gate clock signal, and the like and outputs a pulse signal. A circuit included in the gate driver 201 may be an IC as in the source driver 200 or may be formed using a transistor similar to that in the pixel 203 of the display portion 202.

The gate driver 201 outputs scan signals to gate lines GL[1] to GL[m] (m is a natural number of 2 or more). Note that a plurality of gate drivers 201 may be provided to separately control the gate lines GL[1] to GL[m]. For example, the gate drivers 201 may be provided on the right and left of the display portion 202 and separately control the gate lines GL[1] to GL[m] on a row-by-row basis.

In the display portion 202, the gate lines GL[1] to GL[m] and the source lines SL[1] to SL[n] are provided to intersect at substantially right angles. The pixel 203 is provided at the intersection of the gate line and the source line. For color display, the pixels 203 corresponding to the respective colors of red, green, and blue (RGB) are arranged in sequence in the display portion 202. Note that the pixels of RGB can be arranged in a stripe pattern, a mosaic pattern, a delta pattern, or the like as appropriate. Without limitation to RGB, a pixel corresponding to white, yellow, or the like may be added for color display.

Figure 14A:
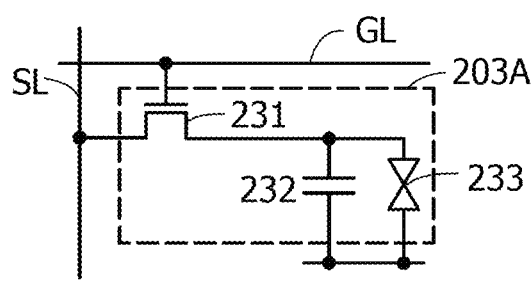
FIGS. 14A and 14B are circuit diagrams each illustrating one embodiment of the present invention.
Figure 14B:
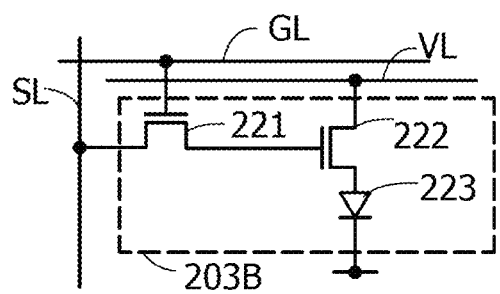

FIGS. 14A and 14B illustrate structure examples of the pixel 203.

A pixel 203A in FIG. 14A is an example of a pixel included in a liquid crystal display device and includes a transistor 231, a capacitor 232, and a liquid crystal element 233.

The transistor 231 serves as a switching element for controlling the connection between the liquid crystal element 233 and the source line SL. The on/off state of the transistor 231 is controlled by a scan signal input to its gate through the gate line GL.

The capacitor 232 is, for example, an element formed by stacking conductive layers.

The liquid crystal element 233 includes a common electrode, a pixel electrode, and a liquid crystal layer, for example. Alignment of the liquid crystal material of the liquid crystal layer is changed by the action of an electric field generated between the common electrode and the pixel electrode.

A pixel 203B in FIG. 14B is an example of a pixel included in an EL display device and includes a transistor 221, a transistor 222, and an EL element 223. FIG. 14B illustrates a power supply line VL in addition to the gate line GL and the source line SL. The power supply line VL is a wiring for supplying current to the EL element 223.

The transistor 221 serves as a switching element for controlling the connection between a gate of the transistor 222 and the source line SL. The on/off state of the transistor 221 is controlled by a scan signal input to its gate through the gate line GL.

The transistor 222 has a function of controlling current flowing between the power supply line VL and the EL element 223, in accordance with voltage supplied to the gate of the transistor 222.

The EL element 223 is, for example, an element including a light-emitting layer provided between electrodes. The luminance of the EL element 223 can be controlled by the amount of current that flows through the light-emitting layer.

The above-described display device in the circuit block diagram includes the semiconductor device 10 or the semiconductor device 10A described in the above embodiment. Accordingly, the fluctuation in grayscale voltage due to the offset voltage can be suppressed.

Embodiment 3

In this embodiment, an example of a cross-sectional structure of a semiconductor device in one embodiment of the present invention will be described with reference to FIG. 15.

The semiconductor device in the above embodiment includes the digital-to-analog converter circuit 11, the differential amplifier circuit 14, the current source 17, the differential amplifier circuit 18, the current source 21, the switching circuit 13, the current-voltage converter circuit 23, and the like and can be formed using transistors including silicon or the like. As silicon, polycrystalline silicon, microcrystalline silicon, or amorphous silicon can be used. Note that an oxide semiconductor or the like can be used instead of silicon.

Figure 15:
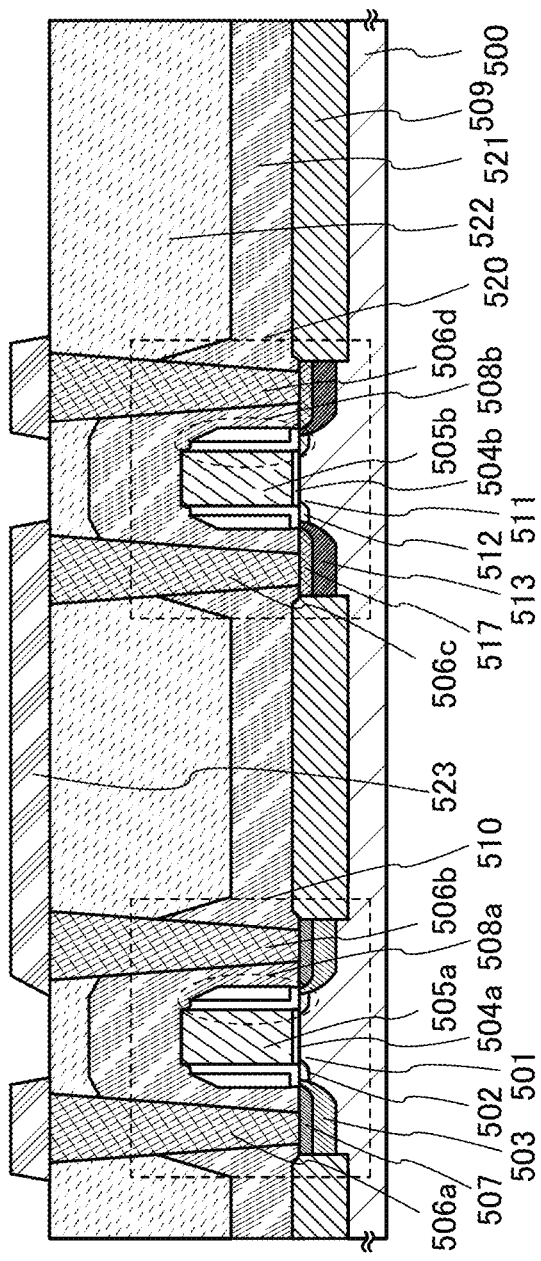
FIG. 15 is a schematic cross-sectional view illustrating one embodiment of the present invention.

FIG. 15 is a schematic cross-sectional view of a semiconductor device of one embodiment of the present invention. The semiconductor device in the schematic cross-sectional view of FIG. 15 includes an n-channel transistor and a p-channel transistor that contain a semiconductor material (e.g., silicon).

An n-channel transistor 510 includes a channel formation region 501 in a substrate 500 containing a semiconductor material, low-concentration impurity regions 502 and high-concentration impurity regions 503 (collectively referred to simply as impurity regions in some cases) with the channel formation region 501 placed between the impurity regions, intermetallic compound regions 507 in contact with the impurity regions, a gate insulating film 504a over the channel formation region 501, a gate electrode layer 505a over the gate insulating film 504a, and a source electrode layer 506a and a drain electrode layer 506b in contact with the intermetallic compound regions 507. A sidewall insulating film 508a is provided on a side surface of the gate electrode layer 505a. An interlayer insulating film 521 and an interlayer insulating film 522 are provided to cover the transistor 510. The source electrode layer 506a and the drain electrode layer 506b are connected to the intermetallic compound regions 507 through openings formed in the interlayer insulating films 521 and 522.

A p-channel transistor 520 includes a channel formation region 511 in the substrate 500 containing the semiconductor material, low-concentration impurity regions 512 and high-concentration impurity regions 513 (collectively referred to simply as impurity regions in some cases) with the channel formation region 511 placed between the impurity regions, intermetallic compound regions 517 in contact with the impurity regions, a gate insulating film 504b over the channel formation region 511, a gate electrode layer 505b over the gate insulating film 504b, and a source electrode layer 506c and a drain electrode layer 506d in contact with the intermetallic compound regions 517. A sidewall insulating film 508b is provided on a side surface of the gate electrode layer 505b. The interlayer insulating films 521 and 522 are provided to cover the transistor 520. The source electrode layer 506c and the drain electrode layer 506d are connected to the intermetallic compound regions 517 through openings formed in the interlayer insulating films 521 and 522.

An element isolation insulating film 509 is provided in the substrate 500 to surround the transistors 510 and 520.

Although FIG. 15 shows the case where the channels of the transistors 510 and 520 are formed in the semiconductor substrate, the channels of the transistors 510 and 520 may be formed in an amorphous semiconductor film or a polycrystalline semiconductor film formed over an insulating surface. Alternatively, the channels of the transistors may be formed in a single crystal semiconductor film, as in the case of using an SOI substrate.

When the transistors 510 and 520 are formed using a single crystal semiconductor substrate, the transistors 510 and 520 can operate at high speed.

Accordingly, a single crystal semiconductor substrate is preferably used for transistors that form each circuit described in the above embodiment.

The transistor 510 is connected to the transistor 520 through a wiring 523. It is possible to employ a structure where an interlayer insulating film and an electrode layer are provided over the wiring 523 and another transistor is stacked over them.

Embodiment 4

In this embodiment, an application example of the semiconductor device described in the foregoing embodiments to a display panel, application examples of the display panel to a display module, an application example of the display module, and application examples of the display module to an electronic device will be described with reference to FIGS. 16A and 16B, FIG. 17, and FIGS. 18A to 18E.

<Examples of Mounting Semiconductor Device on Display Panel>

An example of mounting the semiconductor device on a display panel will be described with reference to FIGS. 16A and 16B.

Figure 16A:
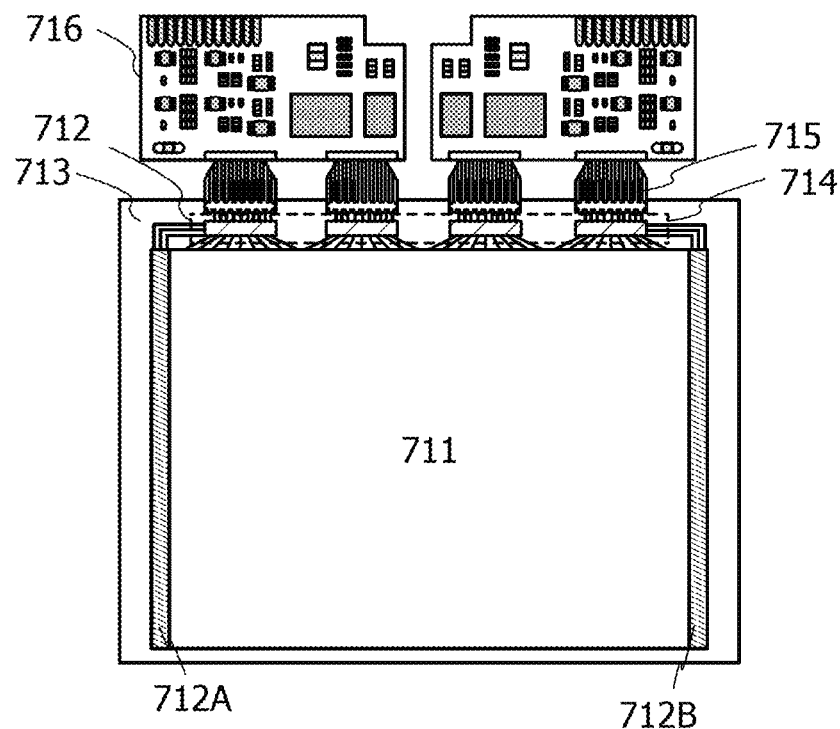
FIGS. 16A and 16B each illustrate a display panel of one embodiment of the present invention.

FIG. 16A illustrates an example where a source driver 712 and gate drivers 712A and 712B are provided around a display portion 711 of the display panel and a source driver IC 714 including the semiconductor device is mounted on a substrate 713 as the source driver 712.

The source driver IC 714 is mounted on the substrate 713 using an anisotropic conductive adhesive and an anisotropic conductive film.

The source driver IC 714 is connected to an external circuit board 716 via an FPC 715.

Figure 16B:
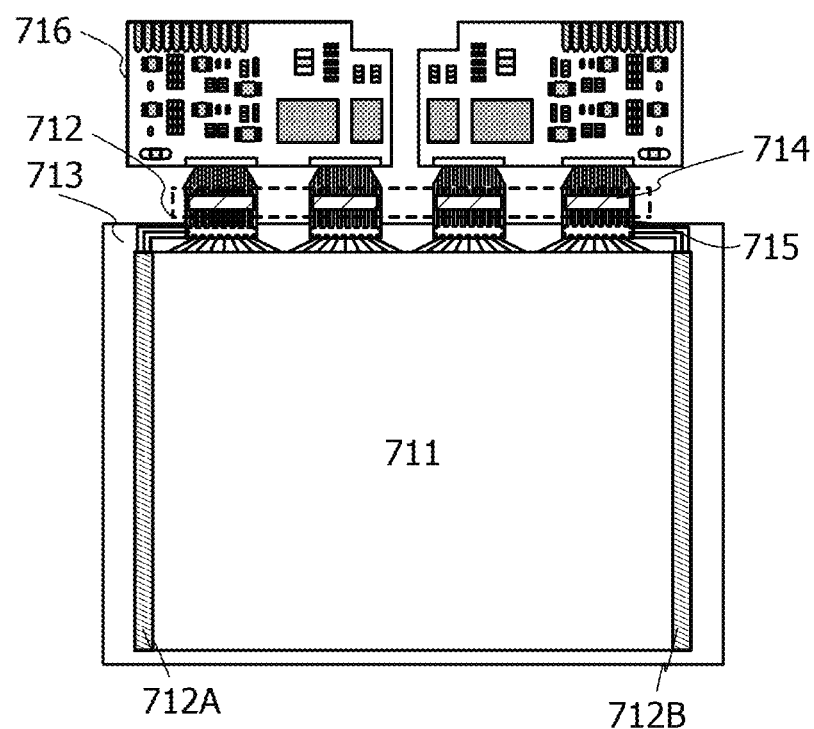

FIG. 16B illustrates an example where the source driver 712 and the gate drivers 712A and 712B are provided around the display portion 711 and the source driver IC 714 is mounted on the FPC 715 as the source driver 712.

Mounting the source driver IC 714 on the FPC 715 allows a larger display portion 711 to be provided over the substrate 713, resulting in a narrower frame.

<Application Example of Display Module>

Next, an application example of a display module using the display panel illustrated in FIG. 16A or FIG. 16B will be described with reference to FIG. 17.

Figure 17:
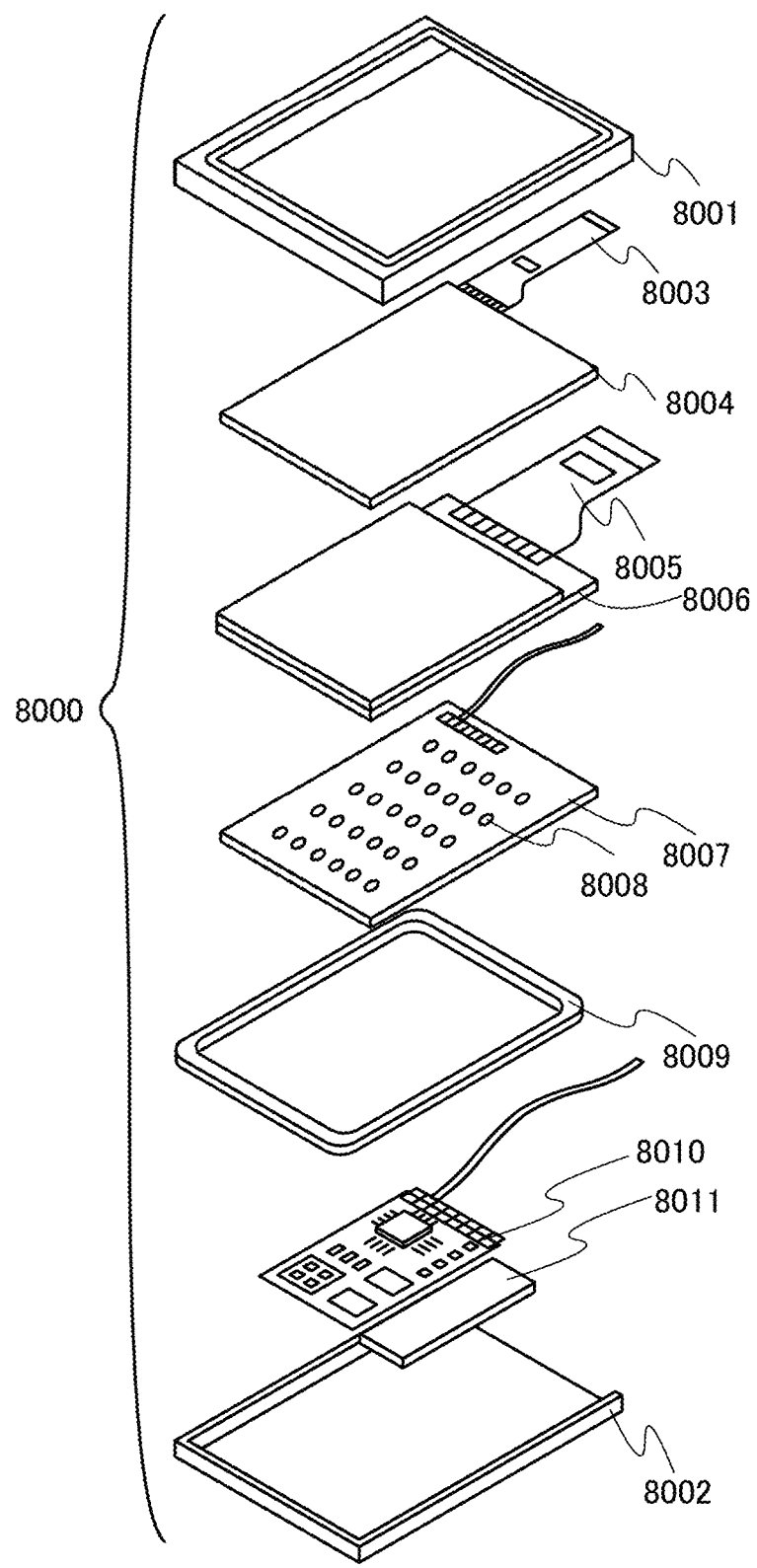
FIG. 17 illustrates a display module of one embodiment of the present invention.

In a display module 8000 illustrated in FIG. 17, a touch panel 8004 connected to an FPC 8003, a display panel 8006 connected to an FPC 8005, a backlight unit 8007, a frame 8009, a printed circuit board 8010, and a battery 8011 are provided between an upper cover 8001 and a lower cover 8002. Note that the backlight unit 8007, the battery 8011, the touch panel 8004, and the like are not provided in some cases.

The display panel illustrated in FIG. 16A or FIG. 16B can be used as the display panel 8006 in FIG. 17.

The shape and size of the upper cover 8001 and the lower cover 8002 can be changed as appropriate in accordance with the size of the touch panel 8004 and the display panel 8006.

The touch panel 8004 can be a resistive touch panel or a capacitive touch panel and can be formed to overlap with the display panel 8006. It is also possible to provide a touch panel function for a counter substrate (sealing substrate) of the display panel 8006. Alternatively, a photosensor may be provided in each pixel of the display panel 8006 so that an optical touch panel is obtained. Further alternatively, an electrode for a touch sensor may be provided in each pixel of the display panel 8006 so that a capacitive touch panel is obtained. In such cases, the touch panel 8004 can be omitted.

The backlight unit 8007 includes a light source 8008. The light source 8008 may be provided at an end portion of the backlight unit 8007 and a light diffusing plate may be used.

The frame 8009 protects the display panel 8006 and functions as an electromagnetic shield for blocking electromagnetic waves generated by the operation of the printed circuit board 8010. The frame 8009 may also function as a radiator plate.

The printed circuit board 8010 is provided with a power supply circuit and a signal processing circuit for outputting a video signal and a clock signal. As a power source for supplying power to the power supply circuit, an external commercial power source or a separate power source using the battery 8011 may be used. The battery 8011 can be omitted in the case of using a commercial power source.

The display module 8000 may be additionally provided with a polarizing plate, a retardation plate, a prism sheet, or the like.

<Examples of Application to Electronic Device>

Next, an electronic device having a display panel including the above display module will be described. Examples of the electronic device include a computer, a portable information terminal (including a mobile phone, a portable game machine, and an audio reproducing device), electronic paper, a television device (also referred to as television or television receiver), and a digital video camera.

Figure 18A:
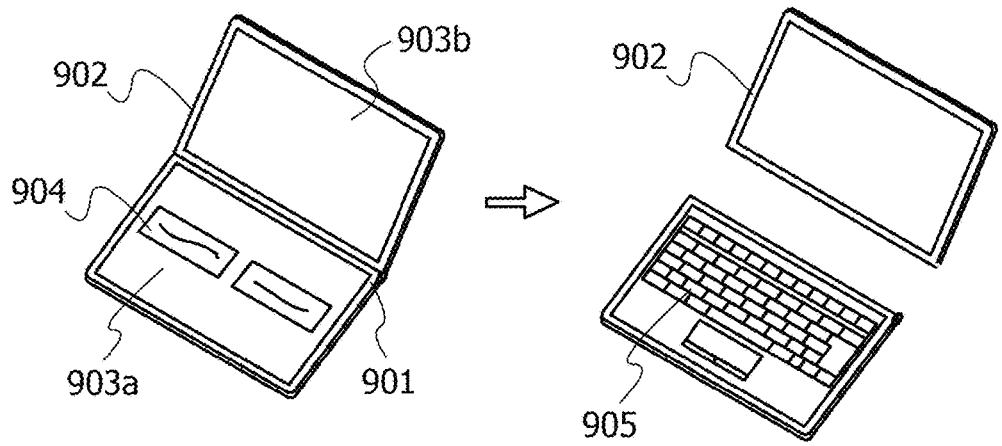
FIGS. 18A to 18E each illustrate an electronic device of one embodiment of the present invention.

FIG. 18A illustrates a portable information terminal that includes a housing 901, a housing 902, a first display portion 903a, a second display portion 903b, and the like. At least one of the housings 901 and 902 is provided with the display module including the semiconductor device of the foregoing embodiment. It is thus possible to obtain a portable information terminal with a smaller circuit area and improved display quality.

The first display portion 903a is a panel having a touch input function, and for example, as illustrated in the left of FIG. 18A, which of "touch input" and "keyboard input" is performed can be selected by a selection button 904 displayed on the first display portion 903a. Since selection buttons with a variety of sizes can be displayed, the information terminal can be easily used by people of any generation. For example, when "keyboard input" is selected, a keyboard 905 is displayed on the first display portion 903a as illustrated in the right of FIG. 18A. Thus, letters can be input quickly by keyboard input as in a conventional information terminal, for example.

One of the first display portion 903a and the second display portion 903b can be detached from the portable information terminal as shown in the right of FIG. 18A. Providing the second display portion 903b with a touch input function makes the information terminal convenient to carry because a weight to carry around can be further reduced and the information terminal can operate with one hand while the other hand supports the housing 902.

The portable information terminal in FIG. 18A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information terminal illustrated in FIG. 18A may transmit and receive data wirelessly. Through wireless communication, desired book data or the like can be purchased and downloaded from an e-book server.

Furthermore, the housing 902 in FIG. 18A may be equipped with an antenna, a microphone function, and a wireless communication function to be used as a mobile phone.

Figure 18B:
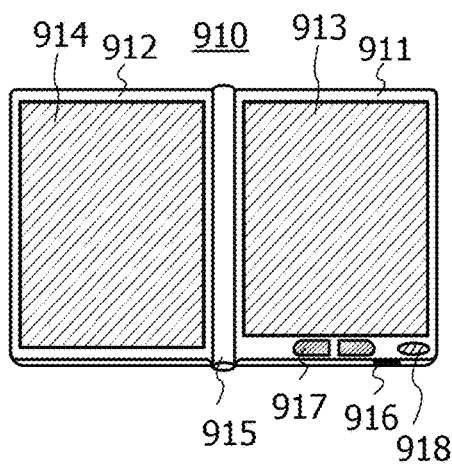

FIG. 18B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The display module including the semiconductor device of the foregoing embodiment is provided in at least one of the housings 911 and 912. It is thus possible to obtain an e-book reader with a smaller circuit area and improved display quality.

Figure 18C:
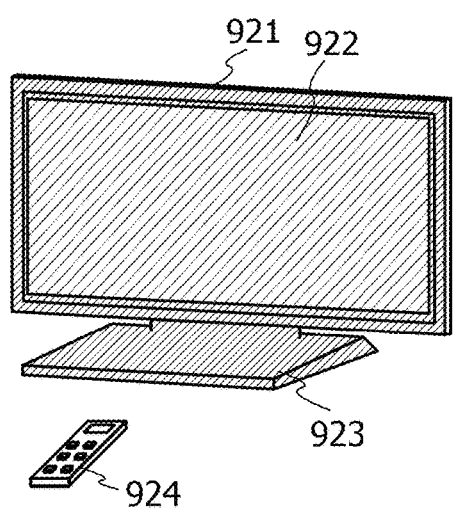

FIG. 18C illustrates a television device including a housing 921, a display portion 922, a stand 923, and the like. The television device 920 can be controlled by a switch of the housing 921 and a remote controller 924. The display module including the semiconductor device of the foregoing embodiment is mounted on the housing 921 and the remote controller 924. Thus, it is possible to obtain a television device with a smaller circuit area and improved display quality.

Figure 18D:
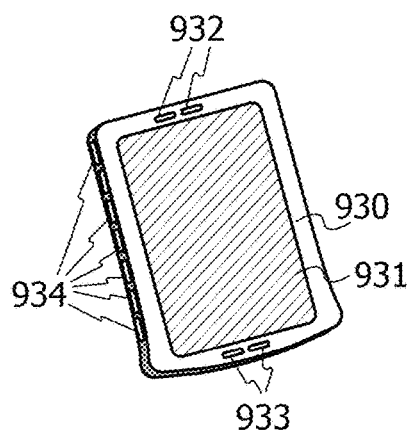

FIG. 18D illustrates a smartphone in which a main body 930 is provided with a display portion 931, a speaker 932, a microphone 933, an operation button 934, and the like. The display module including the semiconductor device of the foregoing embodiment is provided in the main body 930. It is thus possible to obtain a smartphone with a smaller circuit area and improved display quality.

Figure 18E:
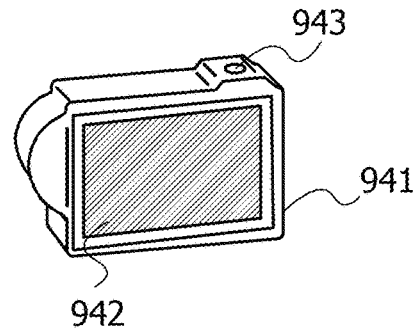

FIG. 18E illustrates a digital camera including a main body 941, a display portion 942, an operation switch 943, and the like. The display module including the semiconductor device of the foregoing embodiment is provided in the main body 941. Consequently, it is possible to obtain a digital camera with a smaller circuit area and improved display quality.

As described above, the display module including the semiconductor device of the foregoing embodiment is provided in the electronic device shown in this embodiment, thereby decreasing the circuit area and improving the display quality.

Embodiment 5

In this embodiment, a structure of a display panel to which the semiconductor device of one embodiment of the present invention can be applied will be described with reference to FIGS. 20A, 20B1, and 20B2, FIGS. 21A to 21C, FIG. 22, and FIGS. 23A, 23B1, and 23B2.

FIGS. 20A, 20B1, and 20B2 illustrate a structure of a display panel 700. FIG. 20A is a bottom view of the display panel 700. FIG. 20B 1 is a bottom view illustrating part of FIG. 20A and FIG. 20B2 is a bottom view in which some components illustrated in FIG. 20B-1 are omitted.

FIGS. 21A to 21C illustrate the structure of the display panel 700. FIG. 21A is a cross-sectional view taken along lines X1-X2, X3-X4, X5-X6, X7-X8, X9-X10, and X11-X12 in FIG. 20A. FIG. 21B is a cross-sectional view illustrating a structure of part of the display panel and FIG. 21C is a cross-sectional view illustrating a structure of another part thereof.

Figure 22:
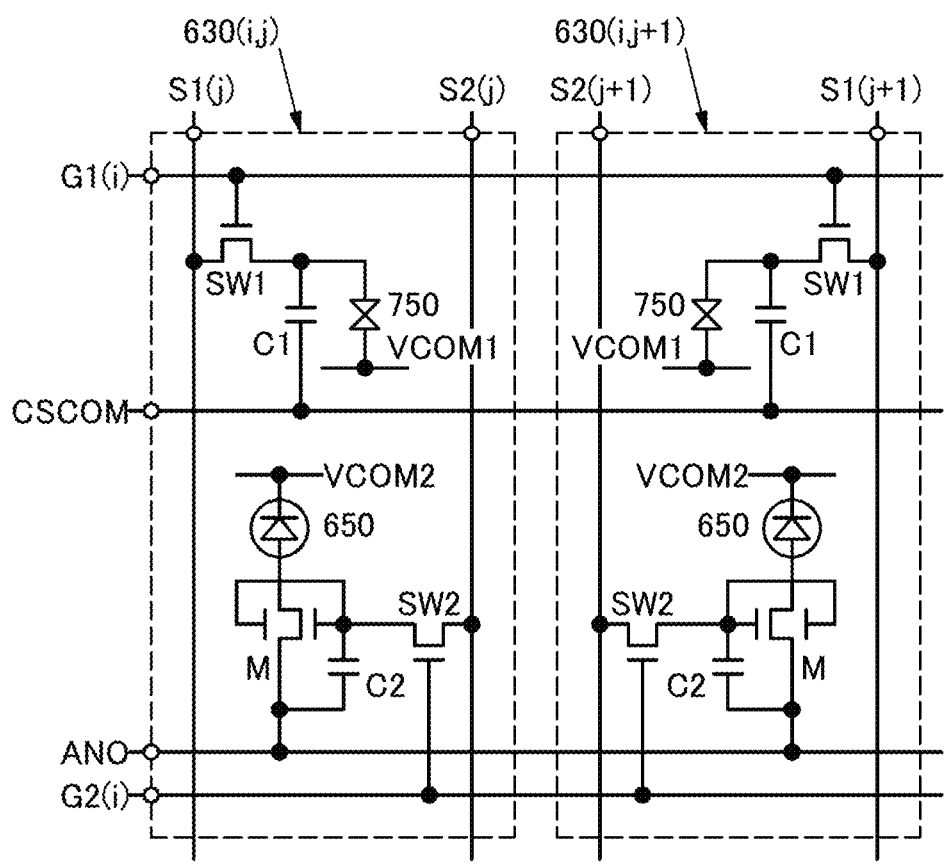
FIG. 22 is a circuit diagram illustrating a pixel circuit of an embodiment.

FIG. 22 illustrates the structure of the display panel 700. FIG. 22 is a circuit diagram of a pixel circuit 630(*i,j*) and a pixel circuit 630(*i,j*+1) which can be used for pixel circuits included in the display panel 700.

FIGS. 23A, 23B1, and 23B2 illustrate the structure of the display panel 700. FIG. 23A is a block diagram illustrating arrangement of pixels, wirings, and the like which can be used for the display panel 700. FIGS. 23B1 and 23B2 are schematic views each illustrating arrangement of openings 751H which can be provided in the display panel 700.

<Structure Example 1 of Display Panel>

The display panel 700 includes a signal line S1(*j*) and a pixel 702(*i,j*) (see FIGS. 20B1 and 20B2).

The pixel 702(*i,j*) is electrically connected to the signal line S1(*j*).

The pixel 702(*i,j*) includes a first display element 750(*i,j*), a first conductive film, a second conductive film, a second insulating film 601C, a pixel circuit 630(*i,j*), and a second display element 650(*i,j*) (see FIG. 21A and FIG. 22).

The first conductive film is electrically connected to the first display element 750(*i,j*) (see FIG. 21A). For example, the first conductive film can be used for a first electrode 751(*i,j*) of the first display element 750(*i,j*).

The second conductive film includes a region overlapping with the first conductive film. For example, the second conductive film can be used for a conductive film 612B serving as a source electrode or a drain electrode of a transistor that can be used for a switch SW1.

The second insulating film 601C includes a region interposed between the second conductive film and the first conductive film.

The pixel circuit 630(*i,j*) is electrically connected to the second conductive film. For example, a transistor using the second conductive film for the conductive film 612B serving as a source electrode or a drain electrode can be used for the switch SW1 of the pixel circuit 630(*i,j*) (see FIG. 21A and FIG. 22).

The second display element 650(*i,j*) is electrically connected to the pixel circuit 630(*i,j*).

The second insulating film 601C has an opening 691A (see FIG. 21A).

The second conductive film is electrically connected to the first conductive film through the opening 691A. For example, the conductive film 612B is electrically connected to the first electrode 751(*i,j*) which also serves as the first conductive film.

The pixel circuit 630(*i,j*) is electrically connected to the signal line S1(*j*) (see FIG. 22). Note that the conductive film 612A is electrically connected to the signal line S1(*j*) (see FIG. 21A and FIG. 22).

The first electrode 751(*i,j*) includes a side end portion embedded in the second insulating film 601C.

The pixel circuit 630(*i,j*) of the display panel includes the switch SW1. The switch SW1 includes a transistor that includes an oxide semiconductor.

The first display element 750(*i,j*) and the second display element 650(*i,j*) of the display panel perform display in the same direction. For example, a dashed arrow in the drawing denotes the direction in which the first display element 750(*i,j*) performs display by controlling the intensity of external light reflection. In addition, a solid arrow in the drawing denotes the direction in which the second display element 650(*i,j*) performs display (see FIG. 21A).

Furthermore, the second display element 650(*i,j*) of the display panel has a function of displaying images in a region surrounded by a region in which the first display element 750(*i,j*) displays images (see FIG. 23B-1 or FIG. 23B-2). Note that the first display element 750(*i,j*) displays images in a region overlapping with the first electrode 751(*i,j*), and the second display element 650(*i,j*) displays images in a region overlapping with the opening 751H.

The first display element 750(*i,j*) of the display panel includes a reflective film having a function of reflecting incident light and has a function of controlling the intensity of reflected light. The reflective film has the opening 751H. Note that the first conductive film, the first electrode 751(*i,j*), or the like can be used for the reflective film of the first display element 750(*i,j*).

The second display element 650(*i,j*) has a function of emitting light toward the opening 751H.

The display panel includes the pixel 702(*i,j*), a group of pixels 702(*i,*1) to 702(*i,n*), another group of pixels 702(1,*j*) to 702(*m,j*), and a scan line G1(*i*) (see FIG. 23A). Note that i is an integer greater than or equal to 1 and less than or equal to m, j is an integer greater than or equal to 1 and less than or equal to n, and each of m and n is an integer greater than or equal to 1.

The display panel also includes a scan line G2(*i*), a wiring CSCOM, and a wiring ANO.

The group of pixels 702(*i,*1) to 702(*i,n*) include the pixel 702(*i,j*) and are arranged in the row direction (the direction shown by the arrow R in drawings).

The another group of pixels 702(1,*j*) to 702(*m,j*) include the pixel 702(*i,j*) and are arranged in the column direction (the direction shown by the arrow C in drawings) intersecting the row direction.

The scan line G1(*i*) is electrically connected to the group of pixels 702(*i,*1) to 702(*i,n*) arranged in the row direction.

The another group of pixels 702(1,*j*) to 702(*m,j*) arranged in the column direction are electrically connected to the signal line S1(*j*).

For example, the pixel 702(*i,j*+1) adjacent to the pixel 702(*i,j*) in the row direction has an opening in a position different from that of the opening 751H in the pixel 702(*i,j*) (see FIG. 23B1).

For example, the pixel 702(*i*+1,*j*) adjacent to the pixel 702(*i,j*) in the column direction has an opening in a position different from that of the opening 751H in the pixel 702(*i,j*) (see FIG. 23B2). Note that for example, the first electrode 751(*i,j*) can be used for the reflective film.

The above-described display panel includes the first display element, the first conductive film electrically connected to the first display element, the second conductive film including a region overlapping with the first conductive film, the insulating film including a region between the second conductive film and the first conductive film, the pixel circuit electrically connected to the second conductive film, and the second display element electrically connected to the pixel circuit. The second insulating film includes the opening and the second conductive film and the first conductive film are electrically connected to each other through the opening.

Thus, the first display element and the second display element that displays an image using a method different from that of the first display element can be driven using pixel circuits that can be formed in the same process. Thus, the novel display panel can be highly convenient or reliable.

The display panel also includes a terminal 619B and a conductive film 611B (see FIG. 21A).

The second insulating film 601C includes a region between the terminal 619B and the conductive film 611B. The second insulating film 601C has an opening 691B.

The terminal 619B is electrically connected to the conductive film 611B in the opening 691B. In addition, the conductive film 611B is electrically connected to the pixel circuit 630(i,j). For example, in the case where the first electrode 751(i,j) or the first conductive film is used for the reflective film, a surface serving as a contact of the terminal 619B faces in the same direction as a surface of the first electrode 751(i,j) which faces light incident on the first display element 750(i,j).

Thus, power or signals can be supplied to the pixel circuit through the terminal. Thus, the novel display panel can be highly convenient or reliable.

The first display element 750(i,j) of the display panel includes a layer 753 containing a liquid crystal material, the first electrode 751(i,j), and a second electrode 752. The second electrode 752 is positioned such that an electric field which controls the alignment of the liquid crystal material is generated between the second electrode 752 and the first electrode 751(i,j).

The display panel also includes an alignment film AF1 and an alignment film AF2. The alignment film AF2 is provided such that the layer 753 containing a liquid crystal material is interposed between the alignment film AF1 and the alignment film AF2.

The second display element 650(i,j) of the display panel includes a third electrode 651(i,j), a fourth electrode 652, and a layer 653(j) containing a light-emitting organic compound.

The fourth electrode 652 includes a region overlapping with the third electrode 651(i,j). The layer 653(j) containing a light-emitting organic compound is provided between the third electrode 651 and the fourth electrode 652. The third electrode 651(i,j) is electrically connected to the pixel circuit 630(i,j) at a connection portion 622.

The pixel 702(i,j) of the display panel includes a coloring film CF1, a light-blocking film BM, an insulating film 771, and a functional film 770P.

The coloring film CF1 includes a region overlapping with the first display element 750(i,j). The light-blocking film BM has an opening in a region overlapping with the first display element 750(i,j).

The insulating film 771 is provided between the coloring film CF1 and the layer 753 containing a liquid crystal material or between the light-blocking film BM and the layer 753 containing a liquid crystal material. The insulating film 771 can reduce unevenness due to the thickness of the coloring film CF1. Furthermore, the insulating film 771 can prevent impurities from diffusing from the light-blocking film BM, the coloring film CF1, or the like to the layer 753 containing a liquid crystal material.

The functional film 770P includes a region overlapping with the first display element 750(i,j). The functional film 770P is provided such that a substrate 770 is interposed between the functional film 770P and the first display element 750(i,j).

The display panel includes a substrate 670, the substrate 770, and a functional layer 620.

The substrate 770 includes a region overlapping with the substrate 670. The functional layer 620 is provided between the substrate 670 and the substrate 770.

The functional layer 620 includes the pixel circuit 630(i, j), the second display element 650(i,j), an insulating film 621, and an insulating film 628. The functional layer 620 includes an insulating film 618 and an insulating film 616.

The insulating film 621 is provided between the pixel circuit 630(i,j) and the second display element 650(i,j).

The insulating film 628 is provided between the insulating film 621 and the substrate 670, and has an opening in a region overlapping with the second display element 650(i,j). The insulating film 628 formed along the outer edge of the third electrode 651 can prevent a short circuit between the third electrode 651 and the fourth electrode 652.

The insulating film 618 includes a region interposed between the insulating film 621 and the pixel circuit 630(i,j), and the insulating film 616 includes a region interposed between the insulating film 618 and the pixel circuit 630(i,j).

The display panel also includes a bonding layer 605, a sealing material 705, and a structure body KB1.

The bonding layer 605 is provided between the functional layer 620 and the substrate 670, and has a function of bonding the functional layer 620 and the substrate 670 together.

The sealing material 705 is provided between the functional layer 620 and the substrate 770, and has a function of bonding the functional layer 620 and the substrate 770 together.

The structure body KB1 has a function of providing a certain space between the functional layer 620 and the substrate 770.

The display panel also includes a terminal 619C, a conductive film 611C, and a conductor CP.

The second insulating film 601C includes a region interposed between the terminal 619C and the conductive film 611C. The second insulating film 601C has an opening 691C.

The terminal 619C is electrically connected to the conductive film 611C through the opening 691C. The conductive film 611C is electrically connected to the pixel circuit 630(i,j).

The conductor CP is interposed between the terminal 619C and the second electrode 752, and electrically connects the terminal 619C and the second electrode 752.

For example, a conductive particle can be used as the conductor CP.

The display panel also includes a driver circuit GD and a driver circuit SD (see FIG. 20A and FIG. 23A).

The driver circuit GD is electrically connected to the scan line G1(i). The driver circuit GD includes a transistor MD, for example. Specifically, a transistor including a semiconductor film that can be formed in the same process as the transistor included in the pixel circuit 630(i,j) can be used as the transistor MD (see FIGS. 21A and 21C).

The driver circuit SD is electrically connected to the signal line S1(j). The driver circuit SD is electrically connected to a terminal that can be formed in the same process as, for example, the terminal 619B or the terminal 619C with the use of a conductive material.

Individual components included in the display panel will be described below. Note that these units cannot be clearly distinguished and one unit also serves as another unit or may include part of another unit.

For example, the first conductive film can be used for the first electrode $751(i,j)$. Furthermore, the first conductive film can also be used for the reflective film.

The second conductive film can be used for the conductive film 612B serving as the source electrode or the drain electrode of the transistor.

Structure Example 1

The display panel includes the substrate 670, the substrate 770, the structure body KB1, the sealing material 705, and the bonding layer 605.

The display panel also includes the functional layer 620, the insulating film 621, and the insulating film 628.

The display panel also includes the signal line $S1(j)$, a signal line $S2(j)$, a scan line $G1(i)$, the scan line $G2(i)$, the wiring CSCOM, and the wiring ANO.

The display panel also includes a first conductive film or a second conductive film.

The display panel also includes the terminal 619B, the terminal 619C, the conductive film 611B, or the conductive film 611C.

The display panel also includes the pixel circuit $630(i,j)$ or the switch SW1.

The display panel also includes the first display element $750(i,j)$, the first electrode $751(i,j)$, the reflective film, the opening 751H, the layer 753 containing a liquid crystal material, or the second electrode 752.

The display panel also includes the alignment film AF1, the alignment film AF2, the coloring film CF1, the light-blocking film BM, the insulating film 771, or the functional film 770P.

The display panel also includes the second display element $650(i,j)$, the third electrode $651(i,j)$, the fourth electrode 652, or the layer $653(j)$ containing a light-emitting organic compound.

The display panel includes the second insulating film 601C.

The display panel also includes the driver circuit GD or the driver circuit SD.

<<Substrate 670>>

The substrate 670 or the like can be formed using a material having heat resistance high enough to withstand heat treatment in the manufacturing process.

Specifically, non-alkali glass with a thickness of 0.7 mm can be used.

For example, a large-sized glass substrate having any of the following sizes can be used as the substrate 670 or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 670 or the like, an organic material, an inorganic material, a composite material of an organic material and an inorganic material, or the like can be used. For example, an inorganic material such as glass, ceramic, or metal can be used for the substrate 670 or the like.

Specifically, non-alkali glass, soda-lime glass, potash glass, crystal glass, quartz, sapphire, or the like can be used for the substrate 670 or the like. Specifically, an inorganic oxide film, an inorganic nitride film, an inorganic oxynitride film, or the like can be used for the substrate 670 or the like. For example, silicon oxide, silicon nitride, silicon oxynitride, an alumina film, or the like can be used for the substrate 670 or the like. For example, SUS or aluminum can be used for the substrate 670 or the like.

For example, a single crystal semiconductor substrate or a polycrystalline semiconductor substrate of silicon or silicon carbide, a compound semiconductor substrate of silicon germanium or the like, or an SOI substrate can be used as the substrate 670 or the like. Thus, a semiconductor element can be provided over the substrate 670 or the like.

For example, an organic material such as a resin, a resin film, or plastic can be used for the substrate 670 or the like. Specifically, a resin film or resin plate of polyester, polyolefin, polyamide, polyimide, polycarbonate, an acrylic resin, or the like can be used for the substrate 670 or the like.

For example, a composite material formed by attaching a metal plate, a thin glass plate, or a film of an inorganic material to a resin film or the like can be used for the substrate 670 or the like. For example, a composite material formed by dispersing a fibrous or particulate metal, glass, inorganic material, or the like into a resin film can be used for the substrate 670 or the like. For example, a composite material formed by dispersing a fibrous or particulate resin, organic material, or the like into an inorganic material can be used for the substrate 670 or the like.

Furthermore, a single-layer material or a layered material in which a plurality of layers are stacked can be used for the substrate 670 or the like. For example, a layered material in which a base, an insulating film that prevents diffusion of impurities contained in the base, and the like are stacked can be used for the substrate 670 or the like. Specifically, a layered material in which glass and one or a plurality of films that are selected from a silicon oxide layer, a silicon nitride layer, a silicon oxynitride layer, and the like and that prevent diffusion of impurities contained in the glass are stacked can be used for the substrate 670 or the like. Alternatively, a layered material in which a resin and a film for preventing diffusion of impurities that penetrate the resin, such as a silicon oxide film, a silicon nitride film, and a silicon oxynitride film are stacked can be used for the substrate 670 or the like.

Specifically, a resin film, a resin plate, a stack, or the like of polyester, polyolefin, polyamide, polyimide, polycarbonate, an acrylic resin, or the like can be used for the substrate 670 or the like.

Specifically, a material including polyester, polyolefin, polyamide (e.g., nylon or aramid), polyimide, polycarbonate, polyurethane, an acrylic resin, an epoxy resin, or a resin having a siloxane bond can be used for the substrate 670 or the like.

Specifically, polyethylene terephthalate (PET), polyethylene naphthalate (PEN), polyethersulfone (PES), acrylic, or the like can be used for the substrate 670 or the like.

Alternatively, paper, wood, or the like can be used for the substrate 670 or the like.

For example, a flexible substrate can be used as the substrate 670 or the like.

Note that a transistor, a capacitor, or the like can be directly formed on the substrate. Alternatively, a transistor, a capacitor, or the like formed on a substrate for use in manufacturing processes which can withstand heat applied in the manufacturing process can be transferred to the substrate 670 or the like. Thus, a transistor, a capacitor, or the like can be formed over a flexible substrate, for example.

<<Substrate 770>>

For example, a light-transmitting material can be used for the substrate 770. Specifically, any of the materials that can be used for the substrate 670 can be used for the substrate 770. Specifically, non-alkali glass polished to a thickness of approximately 0.7 mm or 0.1 mm can be used.

<<Structure body KB1>>

The structure body KB1 or the like can be formed using an organic material, an inorganic material, or a composite material of an organic material and an inorganic material. This allows a predetermined space to be provided between components between which the structure KB1 or the like is interposed.

Specifically, for the structure body KB1 or the like, polyester, polyolefin, polyamide, polyimide, polycarbonate, polysiloxane, an acrylic resin, or the like, or a composite material of a plurality of kinds of resins selected from these can be used.

Alternatively, a photosensitive material may be used.

<<Sealing material 705>>

For the sealing material 705 or the like, an inorganic material, an organic material, a composite material of an inorganic material and an organic material, or the like can be used.

For example, an organic material such as a thermally fusible resin or a curable resin can be used for the sealing material 705 or the like.

For example, an organic material such as a reactive curable adhesive, a light curable adhesive, a thermosetting adhesive, and/or an anaerobic adhesive can be used for the sealing material 705 or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, or the like can be used for the sealing material 705 or the like.

<<Bonding Layer 605>>

For example, any of the materials that can be used for the sealing material 705 can be used for the bonding layer 605.

<<Insulating Film 621>>

For example, an insulating inorganic material, an insulating organic material, or an insulating composite material containing an inorganic material and an organic material can be used for the insulating film 621 or the like.

Specifically, an inorganic oxide film, an inorganic nitride film, an inorganic oxynitride film, or a material obtained by stacking any of these films and the like can be used as the insulating film 621 or the like. For example, a film including any of a silicon oxide film, a silicon nitride film, a silicon oxynitride film, an aluminum oxide film, or a film including a material obtained by stacking any of these films can be used for the insulating film 621 or the like.

Specifically, for the insulating film 621 or the like, polyester, polyolefin, polyamide, polyimide, polycarbonate, polysiloxane, an acrylic resin, or the like, or a layered or composite material of a plurality of kinds of resins selected from these can be used. Alternatively, a photosensitive material may be used.

Thus, steps due to various components overlapping with the insulating film 621, for example, can be reduced.

<<Insulating Film 628>>

For example, any of the materials that can be used for the insulating film 621 can be used for the insulating film 628 or the like. Specifically, a 1-μm-thick polyimide-containing film can be used as the insulating film 628.

<<Second Insulating Film 601C>>

For example, any of the materials that can be used for the insulating film 621 can be used for the second insulating film 601C. Specifically, a material containing silicon and oxygen can be used for the second insulating film 601C. Thus, diffusion of impurities into the pixel circuit, the second display element, or the like can be inhibited.

For example, a 200-nm-thick film containing silicon, oxygen, and nitrogen can be used as the second insulating film 601C.

Note that the second insulating film 601C has the opening 691A, the opening 691B, and/or the opening 691C.

<<Wiring, Terminal, and Conductive Film>>

A conductive material can be used for the wiring or the like. Specifically, a conductive material can be used for the signal line S1(j), the signal line S2(j), the scan line G1(i), the scan line G2(i), the wiring CSCOM, the wiring ANO, the terminal 619B, the terminal 619C, the conductive film 611B, the conductive film 611C, or the like.

For example, an inorganic conductive material, an organic conductive material, a metal, conductive ceramics, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese can be used for the wiring or the like. Alternatively, an alloy including any of the above-described metal elements, or the like can be used for the wiring or the like. In particular, an alloy of copper and manganese is preferably used in microfabrication using a wet etching method.

Specifically, any of the following structures can be used for the wiring or the like: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like.

Specifically, a conductive oxide, such as indium oxide, indium tin oxide, indium zinc oxide, zinc oxide, or zinc oxide to which gallium is added, can be used for the wiring or the like.

Specifically, a film containing graphene or graphite can be used for the wiring or the like.

For example, a film containing graphene formed by reducing a film containing graphene oxide can be used. The reduction can be performed by applying heat, using a reducing agent, or the like.

Specifically, a conductive high molecular can be used for the wiring or the like.

<<First Conductive Film and Second Conductive Film>>

For example, any of the materials that can be used for the wiring or the like can be used for the first conductive film or the second conductive film.

Alternatively, a first electrode 751(i,j), the wiring, or the like can be used for the first conductive film.

The wiring, the conductive film 612B of the transistor that can be used for the switch SW1, or the like can be used for the second conductive film.

<<Pixel Circuit 630(i,j)>>

The pixel circuit 630(i,j) is electrically connected to the signal line S1(j), the signal line S2(j), the scan line G1(i), the scan line G2(i), the wiring CSCOM, and the wiring ANO (see FIG. 22).

The pixel circuit 630(i,j+1) is electrically connected to a signal line S1(j+1), a signal line S2(j+1), the scan line G1(i), the scan line G2(i), the wiring CSCOM, and the wiring ANO.

In the case where the voltage of a signal supplied to the signal line S2(j) is different from the voltage of a signal supplied to the signal line S1(j+1), the signal line S1(j+1) is positioned apart from the signal line S2(j). Specifically, the signal line S2(j+1) is positioned adjacent to the signal line S2(j).

The pixel circuit 630(i,j) includes the switch SW1, a capacitor C1, a switch SW2, a transistor M, and a capacitor C2.

For example, a transistor including a gate electrode electrically connected to the scan line G1(i) and a first electrode electrically connected to the signal line S1(j) can be used for the switch SW1.

The capacitor C1 includes a first electrode electrically connected to a second electrode of the transistor used for the switch SW1 and a second electrode electrically connected to the wiring CSCOM.

For example, a transistor including a gate electrode electrically connected to the scan line G2(i) and a first electrode electrically connected to the signal line S2(j) can be used for the switch SW2.

The transistor M includes a gate electrode electrically connected to a second electrode of the transistor used for the switch SW2 and a first electrode electrically connected to the wiring ANO.

Note that a transistor including a conductive film provided such that a semiconductor film is interposed between a gate electrode and the conductive film can be used as the transistor M. For example, a conductive film electrically connected to the wiring capable of supplying a potential equal to that supplied to the first electrode of the transistor M can be used.

The capacitor C2 includes a first electrode electrically connected to the second electrode of the transistor used for the switch SW2 and a second electrode electrically connected to the first electrode of the transistor M.

Note that a first electrode and a second electrode of the first display element 750 are electrically connected to the second electrode of the transistor used for the switch SW1 and a wiring VCOM1, respectively. This enables the first display element 750 to be driven.

Note that a first electrode and a second electrode of the second display element 650 are electrically connected to the second electrode of the transistor M and a wiring VCOM2, respectively. This enables the second display element 650 to be driven.

<<Switch SW1, Switch SW2, Transistor M, and Transistor MD>>

For example, a bottom-gate or top-gate transistor can be used for the switch SW1, the switch SW2, the transistor M, the transistor MD, and the like.

For example, a transistor including a semiconductor containing an element belonging to Group 14 in a semiconductor film can be used. Specifically, a semiconductor containing silicon can be used for a semiconductor film. For example, single crystal silicon, polysilicon, microcrystalline silicon, amorphous silicon, or the like can be used for the semiconductor films of the transistors.

For example, a transistor using an oxide semiconductor for a semiconductor film can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used for the switch SW1, the switch SW2, the transistor M, the transistor MD, and the like. Specifically, a transistor using an oxide semiconductor for a semiconductor film 608 can be used for the switch SW1, the switch SW2, the transistor M, the transistor MD, and the like.

Thus, a pixel circuit can hold an image signal for a longer time than a pixel circuit including a transistor that uses amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of a data processing device can be reduced, and power consumption for driving can be reduced.

The transistor that can be used for the switch SW1 includes the semiconductor film 608 and a conductive film 604 including a region overlapping with the semiconductor film 608 (see FIG. 21B). The transistor that can be used for the switch SW1 also includes the conductive film 612A and the conductive film 612B.

Note that the conductive film 604 and the insulating film 606 serve as a gate electrode and a gate insulating film, respectively. The conductive film 612A has one of a function of a source electrode and a function of a drain electrode, and the conductive film 612B has the other.

A transistor including a conductive film 624 provided such that the semiconductor film 608 is interposed between the conductive film 604 and the conductive film 624 can be used as the transistor M (see FIG. 21C).

A conductive film formed by stacking a 10-nm-thick film containing tantalum and nitrogen and a 300-nm-thick film containing copper in this order can be used as the conductive film 604.

A material obtained by stacking a 400-nm-thick film containing silicon and nitrogen and a 200-nm-thick film containing silicon, oxygen, and nitrogen can be used for the insulating film 606.

A 25-nm-thick film containing indium, gallium, and zinc can be used as the semiconductor film 608.

A conductive film formed by stacking a 50-nm-thick film containing tungsten, a 400-nm-thick film containing aluminum, and a 100-nm-thick film containing titanium in this order can be used as the conductive film 612A or the conductive film 612B.

<<First Display Element 750(i,j)>>

For example, a display element having a function of controlling transmission or reflection of light can be used as the first display element 750(i,j). For example, a combined structure of a polarizing plate and a liquid crystal element or a MEMS shutter display element can be used. The use of a reflective display element can reduce power consumption of a display panel. Specifically, a reflective liquid crystal display element can be used as the first display element 750.

Specifically, a liquid crystal element that can be driven by any of the following driving methods can be used: an in-plane switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

For example, thermotropic liquid crystal, low-molecular liquid crystal, high-molecular liquid crystal, polymer dispersed liquid crystal, ferroelectric liquid crystal, or anti-ferroelectric liquid crystal can be used. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

<<First Electrode 751(i,j)>>

For example, the material that is used for the wiring or the like can be used for the first electrode 751(i,j). Specifically, a reflective film can be used for the first electrode 751(i,j).

<<Reflective Film>>

For example, a material that reflects visible light can be used for the reflective film. Specifically, a material containing silver can be used for the reflective film. For example, a material containing silver, palladium, and the like or a material containing silver, copper, and the like can be used for the reflective film.

The reflective film reflects light that passes through the layer 753 containing a liquid crystal material, for example. This allows the first display element 750 to serve as a reflective liquid crystal element. Alternatively, for example, a material with unevenness on its surface can be used for the reflective film. In that case, incident light can be reflected in various directions so that a white image can be displayed.

Note that the first electrode 751(i,j) is not necessarily used for the reflective film. For example, the reflective film can be provided between the layer 753 containing a liquid crystal material and the first electrode 751(i,j). Alternatively, the first electrode 751(i,j) having a light-transmitting property can be provided between the reflective film and the layer 753 containing a liquid crystal material.

<<Opening 751H>>

If the ratio of the total area of the opening 751H to the total area of the reflective film other than the opening is excessively high, an image displayed using the first display element 750(i,j) is dark. If the ratio of the total area of the opening 751H to the total area of the reflective film other than the opening is excessively low, an image displayed using the second display element 650(i,j) is dark.

If the area of the opening 751H in the reflective film is too small, light emitted from the second display element 650 is not efficiently extracted for display.

The opening 751H may have a polygonal shape, a quadrangular shape, an elliptical shape, a circular shape, a cross shape, a stripe shape, a slit-like shape, or a checkered pattern. The opening 751H may be close to the adjacent pixel. The opening 751H is preferably provided close to a pixel that has a function of emitting light of the same color, in which case an undesired phenomenon in which light emitted from the second display element 650 enters a coloring film of the adjacent pixel, which is called cross talk, can be suppressed.

<<Second Electrode 752>>

For example, a material having a visible-light-transmitting property and conductivity can be used for the second electrode 752.

For example, a conductive oxide, a metal film thin enough to transmit light, or a metal nanowire can be used for the second electrode 752.

Specifically, a conductive oxide containing indium can be used for the second electrode 752. Alternatively, a metal thin film with a thickness greater than or equal to 1 nm and less than or equal to 10 nm can be used for the second electrode 752. Alternatively, a metal nanowire containing silver can be used for the second electrode 752.

Specifically, indium oxide, indium tin oxide, indium zinc oxide, zinc oxide, zinc oxide to which gallium is added, zinc oxide to which aluminum is added, or the like can be used for the second electrode 752.

<<Alignment Films AF1 and AF2>>

The alignment films AF1 and AF2 can be formed using a material containing polyimide or the like, for example. Specifically, a material formed to have alignment in the predetermined direction by rubbing treatment or an optical alignment technique can be used.

For example, a film containing soluble polyimide can be used for the alignment films AF1 and AF2.

<<Coloring Film CF1>>

The coloring film CF1 can be formed using a material transmitting light of a predetermined color, and can thus be used as a color filter or the like.

The coloring film CF1 can be formed using a material transmitting light of blue, green, red, yellow, or white, for example.

<<Light-Blocking Film BM>>

A material that prevents light transmission can be used for the light-blocking film BM, in which case the light-blocking film BM serves as a black matrix, for example.

<<Insulating Film 771>>

The insulating film 771 can be formed using polyimide, epoxy resin, acrylic resin, or the like.

<<Functional Film 770P>>

For example, a polarizing plate, a retardation plate, a diffusing film, an anti-reflective film, a condensing film, or the like can be used as the functional film 770P. Alternatively, a polarizing plate containing a dichromatic pigment can be used for the functional film 770P.

Alternatively, an antistatic film preventing the attachment of a foreign substance, a water repellent film suppressing the attachment of stain, a hard coat film suppressing a scratch in use, or the like can be used as the functional film 770P.

<<Second Display Element 650(i,j)>>

A light-emitting element, for example, can be used as the second display element 650(i,j). Specifically, an organic electroluminescence element, an inorganic electroluminescence element, a light-emitting diode, or the like can be used for the second display element 650(i,j).

For example, a stack formed so as to emit blue, green, or red light, or the like can be used for the layer 653(j) containing a light-emitting organic compound.

For example, a belt-like stack that extends in the column direction along the signal line S1(j) can be used for the layer 653(j) containing a light-emitting organic compound. Furthermore, a belt-like stack that extends in the column direction along the signal line S1(j+1) and emits light of a color different from that of light emitted from the layer 653(j) containing a light-emitting organic compound can be used for a layer 653(j+1) containing a light-emitting organic compound.

For example, a stack formed so as to emit white light can be used for the layer 653(j) containing a light-emitting organic compound and the layer 653(j+1) containing a light-emitting organic compound. Specifically, a stack of a layer containing a light-emitting organic compound including a fluorescent material that emits blue light, and a layer containing a material that is other than a fluorescent material and that emits green light and/or red light or a layer containing a material that is other than a fluorescent material and that emits yellow light can be used for the layer 653(j)

containing a light-emitting organic compound and the layer 653(j+1) containing a light-emitting organic compound.

For example, any of the materials that can be used for the wiring or the like can be used for the third electrode 651(i,j) or the fourth electrode 652.

For example, a material that transmits visible light among the materials that can be used for the wiring or the like can be used for the third electrode 651(i,j).

Specifically, conductive oxide, indium-containing conductive oxide, indium oxide, indium tin oxide, indium zinc oxide, zinc oxide, zinc oxide to which gallium is added, or the like can be used for the third electrode 651(i,j). Alternatively, a metal film that is thin enough to transmit light can be used as the third electrode 651(i,j).

For example, a material that reflects visible light among the materials that can be used for the wiring or the like can be used for the fourth electrode 652.

<<Driver Circuit GD>>

Any of a variety of sequential circuits such as a shift register can be used as the driver circuit GD. For example, the transistor MD, a capacitor, and the like can be used in the driver circuit GD. Specifically, a transistor including a semiconductor film that can be formed in the same step as the transistor M can be used.

As the transistor MD, a transistor different from the transistor that can be used for the switch SW1 can be used. Specifically, a transistor including the conductive film 624 can be used for the transistor MD (see FIG. 21C).

The semiconductor film 608 is provided between the conductive films 624 and 604. The insulating film 616 is provided between the conductive film 624 and the semiconductor film 608. The insulating film 606 is provided between the semiconductor film 608 and the conductive film 604. For example, the conductive film 624 is electrically connected to a wiring that supplies a potential equal to that supplied to the conductive film 604.

Note that the transistor MD can have the same structure as the transistor M.

<<Driver Circuit SD>>

For example, an integrated circuit can be used as the driver circuit SD. Specifically, an integrated circuit formed over a silicon substrate can be used as the driver circuit SD.

For example, a chip on glass (COG) method can be used to mount the driver circuit SD on a pad electrically connected to the pixel circuit 630(i,j). Specifically, an anisotropic conductive film can be used to mount the integrated circuit on the pad.

Note that the pad can be formed in the same process as the terminal 619B or the terminal 619C.

<Method for Controlling Resistivity of Oxide Semiconductor Film>

The method for controlling the resistivity of an oxide semiconductor film will be described.

An oxide semiconductor film with a predetermined resistivity can be used for the semiconductor film 608, the conductive film 624, or the like.

For example, a method for controlling the concentration of impurities such as hydrogen and water contained in the oxide semiconductor film and/or the oxygen vacancies in the film can be used as the method for controlling the resistivity of the oxide semiconductor film.

Specifically, plasma treatment can be used as a method for increasing or decreasing the concentration of impurities such as hydrogen and water and/or the oxygen vacancies in the film.

Specifically, plasma treatment using a gas containing one or more kinds selected from a rare gas (He, Ne, Ar, Kr, or Xe), hydrogen, boron, phosphorus, and nitrogen can be employed. For example, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, or plasma treatment in a nitrogen atmosphere can be employed. Thus, the oxide semiconductor film can have a high carrier density and a low resistivity.

Alternatively, hydrogen, boron, phosphorus, or nitrogen is added to the oxide semiconductor film by an ion implantation method, an ion doping method, a plasma immersion ion implantation method, or the like, so that the oxide semiconductor film can have a low resistivity.

Alternatively, an insulating film containing hydrogen is formed in contact with the oxide semiconductor film, and the hydrogen is diffused from the insulating film to the oxide semiconductor film, so that the oxide semiconductor film can have a high carrier density and a low resistivity.

For example, an insulating film with a hydrogen concentration of greater than or equal to $1\times10^{22}$ atoms/cm$^3$ is formed in contact with the oxide semiconductor film, whereby hydrogen can be effectively supplied to the oxide semiconductor film. Specifically, a silicon nitride film can be used as the insulating film formed in contact with the oxide semiconductor film.

Hydrogen contained in the oxide semiconductor film reacts with oxygen bonded to a metal atom to be water, and an oxygen vacancy is formed in a lattice from which oxygen is released (or a portion from which oxygen is released). Due to entry of hydrogen into the oxygen vacancy, an electron serving as a carrier is generated in some cases. Furthermore, bonding of part of hydrogen to oxygen bonded to a metal atom causes generation of an electron serving as a carrier in some cases. Thus, the oxide semiconductor film can have a high carrier density and a low resistivity.

Specifically, an oxide semiconductor film with a hydrogen concentration measured by secondary ion mass spectrometry (SIMS) of greater than or equal to $8\times10^{19}$ atoms/cm$^3$, preferably greater than or equal to $1\times10^{20}$ atoms/cm$^3$, more preferably greater than or equal to $5\times10^{20}$ atoms/cm$^3$ can be suitably used as the conductive film 624.

On the other hand, an oxide semiconductor film with a high resistivity can be used for a semiconductor film where a channel of a transistor is formed. Specifically, the oxide semiconductor film can be suitably used as the semiconductor film 608.

For example, an insulating film containing oxygen, in other words, an insulating film capable of releasing oxygen, is formed in contact with an oxide semiconductor film, and the oxygen is supplied from the insulating film to the oxide semiconductor film, so that oxygen vacancies in the film or at the interface can be filled. Thus, the oxide semiconductor film can have a high resistivity.

For example, a silicon oxide film or a silicon oxynitride film can be used as the insulating film capable of releasing oxygen.

The oxide semiconductor film in which oxygen vacancy is filled with oxygen and the concentration of hydrogen is reduced can be referred to as a highly purified intrinsic or substantially highly purified intrinsic oxide semiconductor film. The term "substantially intrinsic" refers to a state where an oxide semiconductor film has a carrier density lower than $8\times10^{11}$/cm$^3$, preferably lower than $1\times10^{11}$/cm$^3$, more preferably lower than $1\times10^{10}$/cm$^3$. A highly purified intrinsic or substantially highly purified intrinsic oxide semiconductor film has few carrier generation sources, and thus can have a low carrier density. The highly purified intrinsic or substantially highly purified intrinsic oxide semiconductor film has a low density of defect states and accordingly can have a low density of trap states.

Furthermore, a transistor including the highly purified intrinsic or substantially highly purified intrinsic oxide semiconductor film has an extremely low off-state current; even when an element has a channel width of $1 \times 10^6$ μm and a channel length L of 10 m, the off-state current can be lower than or equal to the measurement limit of a semiconductor parameter analyzer, that is, lower than or equal to $1 \times 10^{-13}$ A, at a voltage (drain voltage) between a source electrode and a drain electrode of from 1 V to 10V.

The transistor in which a channel region is formed in the oxide semiconductor film that is a highly purified intrinsic or substantially highly purified intrinsic oxide semiconductor film can have a small change in electrical characteristics and high reliability.

Specifically, an oxide semiconductor having a hydrogen concentration which is measured by SIMS of lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, more preferably lower than $5 \times 10^{18}$ atoms/cm$^3$, more preferably lower than or equal to $1 \times 10^{18}$ atoms/cm$^3$, more preferably lower than or equal to $5 \times 10^{17}$ atoms/cm$^3$, more preferably lower than or equal to $1 \times 10^{16}$ atoms/cm$^3$ can be favorably used for a semiconductor film where a channel of a transistor is formed.

An oxide semiconductor film that has a higher hydrogen concentration and/or a larger number of oxygen vacancies and that has a lower resistivity than the semiconductor film 608 is used as the conductive film 624.

A film whose hydrogen concentration is twice or more, preferably ten times or more the hydrogen concentration in the semiconductor film 608 can be used as the conductive film 624.

A film whose resistivity is greater than or equal to $1 \times 10^{-8}$ times and less than $1 \times 10^{-1}$ times the resistivity of the semiconductor film 608 can be used as the conductive film 624.

Specifically, a film with a resistivity of greater than or equal to $1 \times 10^{-3}$ Ωcm and less than $1 \times 10^4$ Ωcm, preferably greater than or equal to $1 \times 10^{-3}$ Ωcm and less than $1 \times 10^{-1}$ Ωcm can be used as the conductive film 624.

(Supplementary notes on description in this specification and the like) The following are notes on the description of Embodiments 1 to 5 and the structures in Embodiments 1 to 5.

Notes on One Embodiment of the Present Invention Described in Embodiments

One embodiment of the present invention can be constituted by appropriately combining the structure described in an embodiment with any of the structures described in the other embodiments. In addition, in the case where a plurality of structure examples are described in one embodiment, any of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with a text in this specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

One embodiment of the present invention is not limited to those described in Embodiments 1 to 5. For example, in Embodiment 1, a structure using an R-DAC is described as one embodiment of the present invention; however, one embodiment of the present invention is not limited to this. A structure using a DAC other than an R-DAC, for instance, may be one embodiment of the present invention under some circumstances.

Notes on Description for Drawings

In this specification and the like, terms for describing arrangement, such as "over" and "under", are used for convenience to indicate a positional relation between components with reference to drawings. The positional relation between components is changed as appropriate in accordance with a direction in which the components are described. Therefore, the terms for describing arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can also mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case where one circuit is associated with a plurality of functions or a case where a plurality of circuits are associated with one function. Therefore, the segmentation of blocks in a block diagram is not limited by any of the components described in the specification and can be differently determined as appropriate depending on the situation.

In the drawings, the size, the layer thickness, or the region is determined arbitrarily for description convenience; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

Notes on Expressions that can be Rephrased

In this specification and the like, the terms "one of a source and a drain" (or first electrode or first terminal) and "the other of the source and the drain" (or second electrode or second terminal) are used to describe the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground voltage, for example, "voltage" can be replaced with "potential". A ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases.

This specification and the like show a 1T-1C circuit structure where one pixel has one transistor and one capacitor and a 2T-1C circuit structure where one pixel has two transistors and one capacitor; however, this specification and the like are not limited to these. It is possible to employ a circuit structure where one pixel has three or more transistors and two or more capacitors. Moreover, a variety of circuit structures can be obtained by formation of an additional wiring.

Notes on Definitions of Terms

The following are definitions of the terms that are not mentioned in the above embodiments.

<<Switch>>

In this specification and the like, a switch is conducting or not conducting (is turned on or off) to determine whether current flows therethrough or not. Alternatively, a switch has a function of selecting and changing a current path.

For example, an electrical switch or a mechanical switch can be used. That is, any element can be used as a switch as long as it can control current, without limitation to a certain element.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined.

In the case of using a transistor as a switch, the "on state" of the transistor refers to a state in which a source and a drain of the transistor are regarded as being electrically short-circuited. The "off state" of the transistor refers to a state in which the source and the drain of the transistor are regarded as being electrically disconnected.

In the case where a transistor operates just as a switch, there is no particular limitation on the polarity (conductivity type) of the transistor.

An example of a mechanical switch is a switch formed using a microelectromechanical systems (MEMS) technology, such as a digital micromirror device (DMD). Such a switch includes an electrode that can be moved mechanically, and its conduction and non-conduction is controlled with movement of the electrode.

<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a top view of the transistor.

In one transistor, channel lengths in all regions are not necessarily the same.

That is, the channel length of one transistor is not limited to one value in some cases.

Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed.

In one transistor, channel widths in all regions are not necessarily the same. That is, the channel width of one transistor is not limited to one value in some cases. Therefore, in this specification, a channel width is any one of values, the maximum value, the minimum value, or the average value in a region where a channel is formed.

Note that in some transistor structures, a channel width in a region where a channel is actually formed (hereinafter referred to as effective channel width) is different from a channel width shown in a top view of a transistor (hereinafter referred to as apparent channel width). For example, in a transistor having a three-dimensional structure, an effective channel width is larger than an apparent channel width shown in a top view of the transistor, and its influence cannot be ignored in some cases. For example, in a miniaturized transistor having a three-dimensional structure, the proportion of a channel region formed on a side surface of a semiconductor is sometimes high. In that case, an effective channel width obtained when a channel is actually formed is larger than an apparent channel width shown in the top view.

In a transistor having a three-dimensional structure, an effective channel width is difficult to measure in some cases. For example, estimation of an effective channel width from a design value requires an assumption that the shape of a semiconductor is known. Thus, in the case where the shape of a semiconductor is not known accurately, it is difficult to measure an effective channel width accurately.

In view of this, in this specification, in a top view of a transistor, an apparent channel width, which is the length of a portion where a source and a drain face each other in a region where a semiconductor and a gate electrode overlap with each other, is sometimes referred to as a surrounded channel width (SCW). Furthermore, in this specification, the term "channel width" may denote a surrounded channel width or an apparent channel width, or may denote an effective channel width. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one when an effective channel width is used for the calculation is obtained in some cases.

<<Pixel>>

In this specification and the like, one pixel refers to one element whose brightness can be controlled, for example. Therefore, for example, one pixel corresponds to one color element by which brightness is expressed. Accordingly, in a color display device using color elements of red (R), green (G), and blue (B), the smallest unit of an image is formed of three pixels of an R pixel, a G pixel, and a B pixel.

Note that the number of colors for color elements is not limited to three, and more colors may be used. For example, RGBW (W: white) or RGB added with yellow, cyan, or magenta may be employed.

<<Display Element>>

In this specification and the like, a display element includes a display medium whose contrast, luminance, reflectivity, transmittance, or the like is changed by an electrical or magnetic effect. Examples of the display element include an electroluminescent (EL) element, an LED chip (e.g., a white LED chip, a red LED chip, a green LED chip, and a blue LED chip), a transistor (a transistor that emits light depending on current), an electron emitter, a display element including a carbon nanotube, a liquid crystal element, electronic ink, electronic liquid powder (registered trademark), an electrowetting element, an electrophoretic element, a plasma display panel (PDP), a display element using microelectromechanical systems (MEMS) (e.g., a grating light valve (GLV), a digital micromirror device (DMD), a digital micro shutter (DMS), Mirasol (registered trademark), an interferometric modulation (IMOD) element, a MEMS shutter display element, an optical-interference-type MEMS display element, and a piezoelectric ceramic display), a display element using a carbon nanotube, and a display element using a quantum dot. Note that examples of display devices including EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some of or all of pixel electrodes function as reflective electrodes. For example, some of or all of pixel electrodes are formed to contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In the case of a display element including MEMS, a drying agent may be provided in a space where the display element is sealed (or between an element substrate over which the display element is placed and a counter substrate opposed to the element substrate, for example). Providing a drying agent can prevent MEMS and the like from becoming difficult to move or deteriorating easily because of moisture or the like.

<<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path", and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path". Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

This application is based on Japanese Patent Application serial no. 2015-160303 filed with Japan Patent Office on Aug. 17, 2015, the entire contents of which are hereby incorporated by reference.

What is claimed is:
1. A semiconductor device comprising:
a first digital-to-analog converter circuit;
a first differential amplifier circuit;
a second differential amplifier circuit;
a current-voltage converter circuit; and
a switching circuit,
wherein the first digital-to-analog converter circuit is configured to generate a first voltage and a second voltage on the basis of an upper (N−M)-bit digital signal in which N is a natural number of 2 or more and M is a natural number smaller than N,
wherein the first differential amplifier circuit is configured to generate a first current corresponding to a difference between the first voltage and the second voltage on the basis of a current flowing in a first current source,
wherein the second differential amplifier circuit is configured to generate a second current corresponding to a difference between the first voltage and an output voltage of the semiconductor device on the basis of a current flowing in a second current source,
wherein the current-voltage converter circuit is configured to generate the output voltage of the semiconductor device on the basis of a current that is a sum of the first current and the second current,
wherein the first differential amplifier circuit comprises a first input terminal and a second input terminal,
wherein the switching circuit is configured to switch between a first state in which the first voltage is supplied to the first input terminal and the second voltage is supplied to the second input terminal, and a second state in which the first voltage is supplied to the second input terminal and the second voltage is supplied to the first input terminal, and
wherein the switching circuit is configured to switch between the first state and the second state in accordance with an M-bit digital signal.

2. The semiconductor device according to claim 1, wherein the first digital-to-analog converter circuit comprises resistors connected in series and a pass transistor logic to which the (N−M)-bit digital signal is supplied.

3. The semiconductor device according to claim 1, wherein the first differential amplifier circuit and the second differential amplifier circuit are transconductance amplifiers.

4. The semiconductor device according to claim 1,
wherein the first current source comprises resistors connected in series and a pass transistor logic to which the M-bit digital signal is supplied, and
wherein a current is generated on the basis of a voltage value selected in the pass transistor logic.

5. A display device comprising:
a source driver;
a gate driver; and
a display portion operatively connected to the source driver and the gate driver,
wherein the source driver comprises:
a digital circuit portion comprising a shift register and configured to generate a sampling pulse;
a digital-to-analog converter circuit comprising the semiconductor device according to claim 1; and
an output circuit portion comprising a buffer and configured to receive an output signal of the semiconductor device.

6. An electronic device comprising:
the display device according to claim 5; and
an operation button.

7. A semiconductor device to be input with an N-bit digital signal (N is a natural number of 2 or more), the semiconductor device comprising:
a first differential amplifier circuit comprising a first input terminal and a second input terminal;
a first digital-to-analog converter circuit comprising a first output terminal and a second output terminal; and
a switching circuit comprising:
a first input terminal electrically connected to the first output terminal of the first digital-to-analog converter circuit;
a second input terminal electrically connected to the second output terminal of the first digital-to-analog converter circuit;
a first output terminal electrically connected to the first input terminal of the first differential amplifier circuit; and
a second output terminal electrically connected to the second input terminal of the first differential amplifier circuit,
wherein the switching circuit is configured to change electrical connections between the first and second input terminals of the first differential amplifier circuit and the first and second output terminals of the first digital-to-analog converter circuit in accordance with a one-bit digital signal in the N-bit digital signal.

8. The semiconductor device according to claim 7, wherein the switching circuit comprises:
- a first switch between the first input terminal of the switching circuit and the first output terminal of the switching circuit;
- a second switch between the first input terminal of the switching circuit and the second output terminal of the switching circuit;
- a third switch between the second input terminal of the switching circuit and the first output terminal of the switching circuit, and
- a fourth switch between the second input terminal of the switching circuit and the second output terminal of the switching circuit, and wherein the first switch and the fourth switch are configured to be controlled by the one-bit digital signal and the second switch and the third switch are configured to be controlled by an inverted signal of the one-bit digital signal.

9. The semiconductor device according to claim 7, wherein the first differential amplifier circuit comprises:
- a first transistor comprising a gate electrically connected to the first output terminal of the switching circuit; and
- a second transistor comprising a gate electrically connected to the second output terminal of the switching circuit.

10. The semiconductor device according to claim 7, wherein the first differential amplifier circuit is a transconductance amplifier.

11. The semiconductor device according to claim 10, wherein the transconductance amplifier comprises:
- a first n-channel transistor and a first p-channel transistor each comprising a gate electrically connected to the first output terminal of the switching circuit; and
- a second n-channel transistor and a second p-channel transistor each comprising a gate electrically connected to the second output terminal of the switching circuit.

12. The semiconductor device according to claim 7, wherein the first digital-to-analog converter circuit comprises:
- a voltage generation circuit;
- a first pass transistor logic comprising a first plurality of transistors and configured to control an electrical connection between the voltage generation circuit and the first output terminal of the first digital-to-analog converter circuit; and
- a second pass transistor logic comprising a second plurality of transistors and configured to control an electrical connection between the voltage generation circuit and the second output terminal of the first digital-to-analog converter circuit.

13. The semiconductor device according to claim 12, wherein the first pass transistor logic and the second pass transistor logic are each configured to be input with an upper (N−M)-bit digital signal (M is a natural number smaller than N) in the N-bit digital signal to control the electrical connection between the voltage generation circuit and the first output terminal of the first digital-to-analog converter circuit and the electrical connection between the voltage generation circuit and the second output terminal of the first digital-to-analog converter circuit.

14. The semiconductor device according to claim 12, comprising a first current source operatively connected to the first differential amplifier circuit and configure to supply a current flowing in the first differential amplifier circuit.

15. The semiconductor device according to claim 14, wherein the first current source is configured to generate the current on the basis of a lower M-bit digital signal input to the first current source.

16. A display device comprising:
- a source driver;
- a gate driver; and
- a display portion operatively connected to the source driver and the gate driver, wherein the source driver comprises:
- a digital circuit portion comprising a shift register and configured to generate a sampling pulse;
- a digital-to-analog converter circuit comprising the semiconductor device according to claim 7; and
- an output circuit portion comprising a buffer and configured to receive an output signal of the semiconductor device.

17. An electronic device comprising:
the display device according to claim 16; and
an operation button.

* * * * *